United States Patent
Koch et al.

[11] Patent Number: 6,144,495
[45] Date of Patent: *Nov. 7, 2000

[54] PROJECTION LIGHT SOURCE

[75] Inventors: Donald Koch, Burbank; James McGuire, Pasadena, both of Calif.

[73] Assignee: Canon Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/997,699

[22] Filed: Dec. 23, 1997

[51] Int. Cl.⁷ .............................. G02B 27/10; G02B 27/14
[52] U.S. Cl. .......................................... 359/618; 359/629
[58] Field of Search .................................. 355/53, 67, 55; 359/618, 629

[56] References Cited

U.S. PATENT DOCUMENTS

| | | | |
|---|---|---|---|
| 4,939,630 | 7/1990 | Kikuchi et al. | 362/268 |
| 5,594,587 | 1/1997 | Komatsuda et al. | 359/619 |
| 5,729,331 | 3/1998 | Tanaka et al. | 355/53 |
| 5,793,473 | 8/1998 | Koyama et al. | 355/55 |

*Primary Examiner*—Georgia Epps
*Assistant Examiner*—Suzanne Letendre
*Attorney, Agent, or Firm*—Fitzpatrick, Cella, Harper & Scinto

[57] ABSTRACT

A projection light source, and associated method, for generating an arcuate band of light, including an angular integrator, an image dissector, and a relay and remapper. The angular integrator includes a first face, a second face, and a plurality of triangular grooves longitudinally extending along the first face and the second face. The triangular grooves are separated in the transverse direction by gaps, and the triangular grooves on the first face lie in a substantially orthogonal direction to the triangular grooves on the second face. Light passes from the first face to the second face. The image dissector includes an input face, an output face, and plural elements that redirect light from the input face to the output face. The output face has a substantially rectangular shape that is different than that of the input face. At least one of the plural elements has at least one coating that reduces optical transmission efficiency of the element. The relay and remapper include a lens system and a parabolic mirror. The lens system has a highly curved field that distorts the substantially rectangular-shaped band of light into a curved image whose radius of curvature is the same as the arcuate band of light. The parabolic mirror has a latus rectum that is approximately equal to a curvature of the substantially arcuate band of light and has a cross section at the latus rectum.

43 Claims, 34 Drawing Sheets

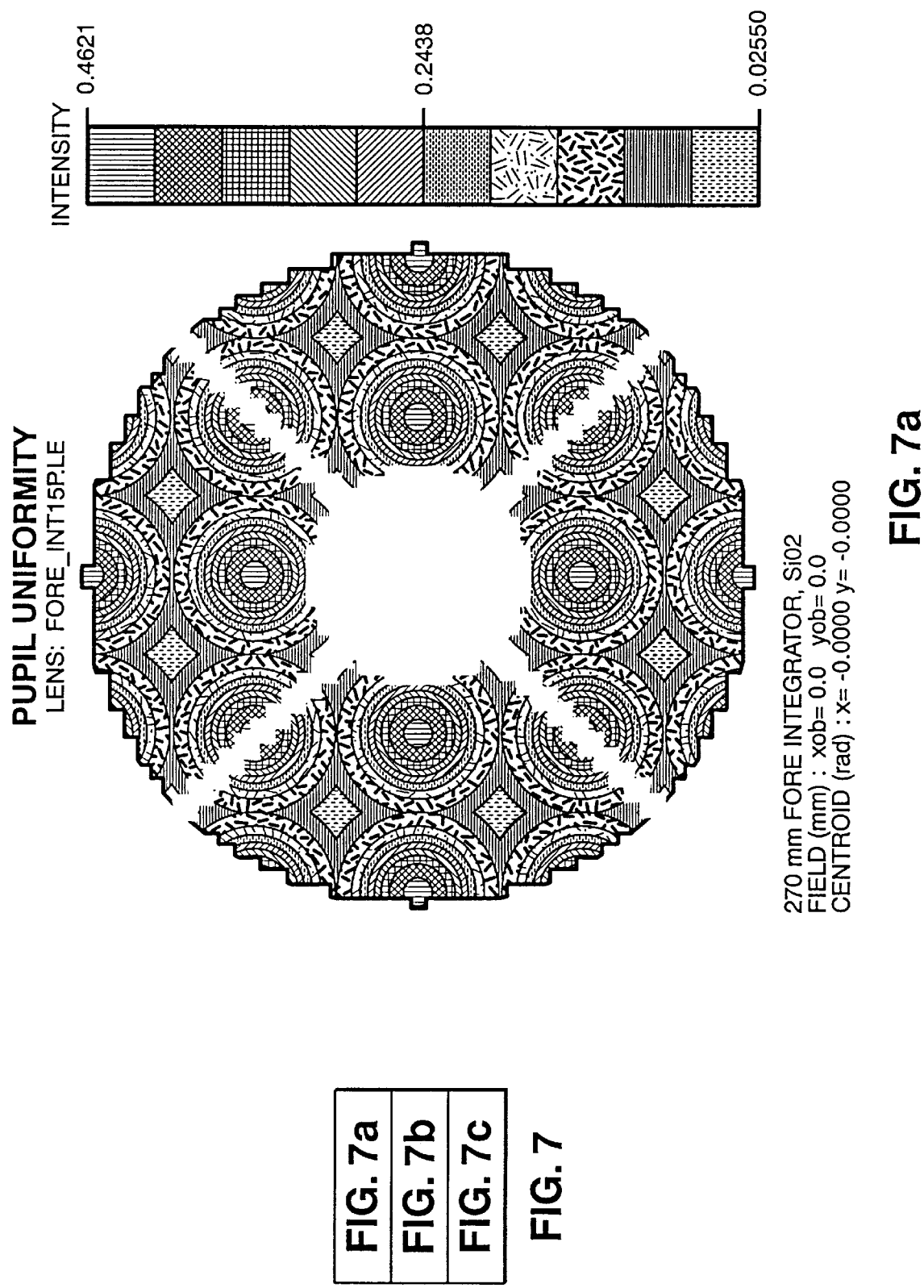

| FIG. 10a |
|---|
| FIG. 10b |
| FIG. 10c |

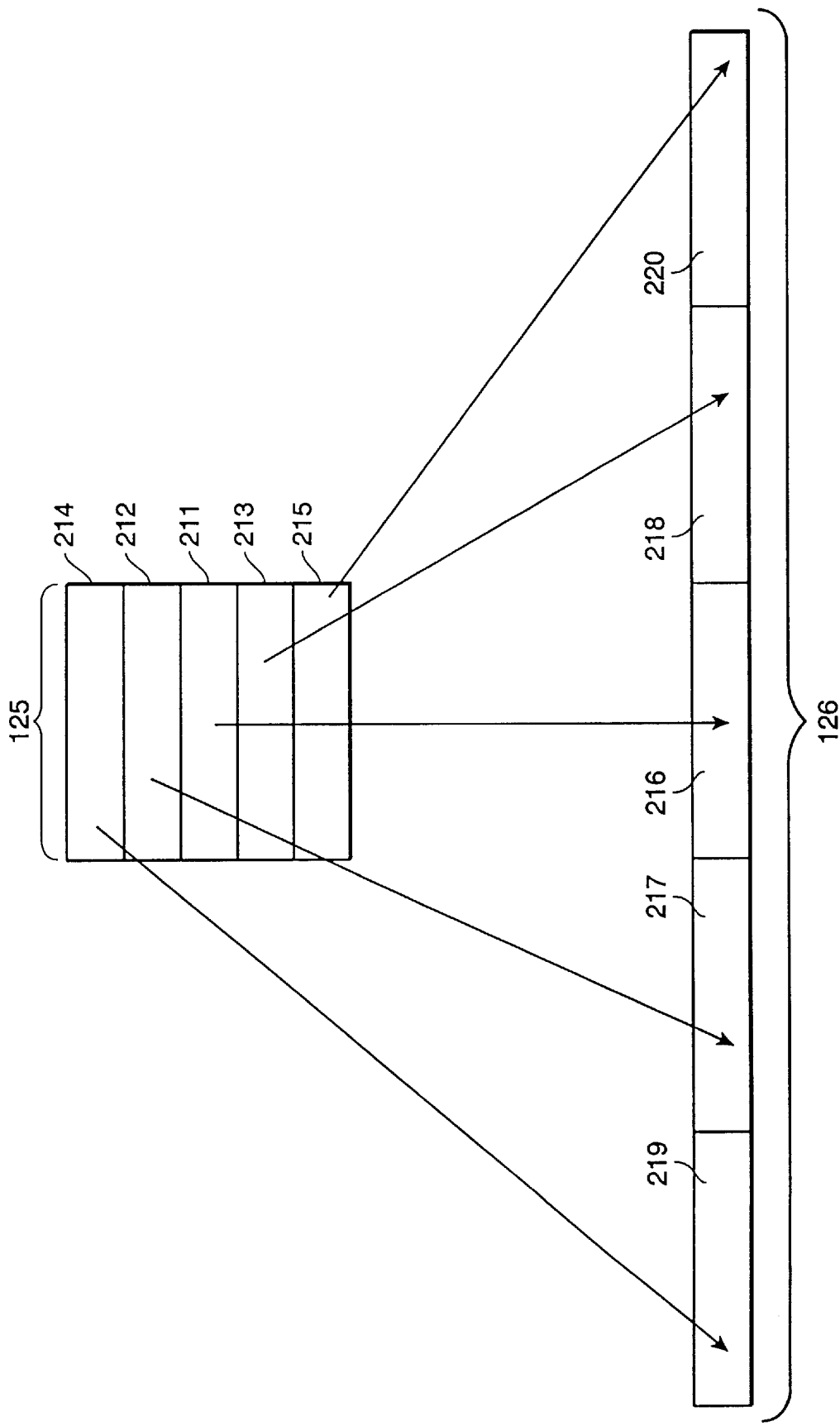

| FIG. 14a |
|----------|
| FIG. 14b |
| FIG. 14c |
| FIG. 14d |
| FIG. 14e |
| FIG. 14f |

PROJECTION LIGHT SOURCE

BACKGROUND OF THE INVENTION

1. Field of the Invention

The present invention relates to a projection light source for use with a photolithographic projector. In particular, the present invention is an illumination system for use with a ring field projector.

2. Description of the Related Art

Ring field projectors are optical projectors used in photolithography, which is a process by which masks for circuit patterns are created on silicon for microprocessors and other computer chips. An example of a ring field projector is an Offner projector. In a ring field projector, a projection light source is used to create an arcuate band of light. This light is then used by the ring field projector to project a reticle of the desired circuit pattern onto the target silicon.

FIG. 1 is a view of a schematic representation of a conventional ring field projector. As shown in FIG. 1, a ring field projector includes trapezoidal mirror 2, concave mirror 3, and convex mirror 4. Reticle 1 carries an image of one layer for the desired circuit pattern. Arcuate band of light 6 from a projection light source (not shown) passes through reticle 1, and an arc-shaped image of the circuit pattern illuminated by arcuate band of light 6 is projected onto target silicon 7. Both reticle 1 and target silicon 7 are moved in coordination in a direction parallel to line A so as to cause arcuate band of light 6 to scan across the entire surface of reticle 1. As arcuate band of light 6 is scanned across reticle 1, an image of the entire circuit pattern is scanningly formed onto target silicon 7. Scanning speed, and thus overall efficiency, depends upon the amount of light projected through reticle 1 and the exposure required for target silicon 7.

After the circuit pattern is projected onto the target silicon, subsequent processing develops the image of the circuit pattern. The pattern is etched, doped or otherwise processed, thereby creating one layer for the desired circuit. The process of projection, development, and processing is repeated for each subsequent layer.

In order to be well-suited for this type of projector, a projection light source must produce an arcuate band of light with special optical characteristics. These optical characteristics include symmetrical pupil irradiance, symmetrical pupil distribution, uniform numerical aperture, and telecentricity.

Conventional projection light sources produce a region of light with the desired optical characteristics, but not the desired arcuate shape. In order to get the arcuate shape, the light passes through an arc-shaped mask in a screen. Masking, however, results in significant loss in light energy. Only a small amount of light passes through the arc-shaped mask, with the rest of the light being blocked by the mask. Since there is less light energy, exposure times are lengthened, resulting in poor efficiency.

Attempts have been made to increase the uniformity and telecentricity of projection light sources, for example by redistributing light energy through non-lens elements such as prisms and fly-eye arrangements. Although these methods result in increased uniformity and telecentricity, they also produce rectangular bands of light that are not matched to the arcuate field of the projector.

Attempts have been made to reformat the light using fiber optics. See Kanti Jain, *Advances in Eximer Laser Lithography,* 774 Lasers in Microlithography 115 (SPIE 1987). However, these attempts introduce non-uniformity in the image. Attempts have been made to reformat the light by reflecting off cylindrical mirrors. Although these attempts result in increased light energy, they also introduce non-preferred optical characteristics such as asymmetrical pupil irradiance and distribution, non-uniform numerical aperture, or decreased telecentricity. Accordingly, there is a need for a projection light source that generates an intense arcuate band of light (i.e., more intense than that produced by conventional systems) with symmetrical pupil irradiance, symmetrical pupil distribution, uniform numerical aperture, and a high degree of telecentricity.

SUMMARY OF THE INVENTION

The present invention addresses the foregoing by providing a projection light source that generates an arcuate band of light. The projection light source includes optical elements that form a light into a substantially telecentric rectangular-shaped band of light. In the preferred embodiment, these optical elements include a field lens, a fore-integrator, an angular integrator, an image dissector, and a post-integrator. The projection light source also includes a relay that forms an intermediate image from the rectangular-shaped band of light, a remapper that deforms the intermediate image into a band of light with a curved image field and that forms the band of light with a curved image field into an arcuate band of light that is substantially telecentric, and a reimager that reimages the arcuate band of light from the remapper. After reimaging, the light is suitable for illumination of a reticle in a ring field projector.

By means of this arrangement, the invention can generate an intense arcuate band of light with the optical characteristics required for use with a ring field projector. When used with a ring field projector, the intense arcuate band of light advantageously increases the efficiency of the projector.

In one aspect, the invention is an angular integrator adaptable for use with a projection light source. The angular integrator includes a first face, a second face, and a plurality of grooves longitudinally extending along the first face and the second face. In the preferred embodiment, the grooves are triangular grooves. The grooves are separated in the transverse direction by gaps, and the grooves on the first face lie in a substantially orthogonal direction to the grooves on the second face. Light passes from the first face to the second face.

By means of this arrangement, the angular integrator divides a light, which is preferably the output of a fore-integrator, into multiple separate beams whose sum is nearly telecentric. The multiple beams have small angular shifts that smear out the irradiance variations present in the exit pupil of the fore-integrator. This smearing both increases the symmetry of pupil irradiance and distribution and increases the telecentricity of the average light cone. These optical characteristics make the light more suitable for use with a ring field projector.

Preferably, the gaps are approximately as wide as the grooves. By means of this arrangement, an irradiance of the second face of the angular integrator is nearly uniform. Alternatively, all of the grooves are on a single face.

In another aspect, the invention is an image dissector adaptable for use with a projection light source. The image dissector includes an input face, an output face, and plural elements that redirect light from the input face to the output face. The output face has a substantially rectangular shape that is different than that of the input face. Preferably, the input face has a substantially square shape. At least one of the plural elements has at least one coating that reduces optical transmission efficiency of the element so as to ensure approximately uniform irradiance of the output face.

By means of this arrangement, the image dissector transforms a light into a substantially rectangular-shaped band of light without significant loss of telecentricity or of uniformity of irradiance.

Preferably, the plural elements of the image dissector include an interior element, two intermediate elements, and an exterior element. The interior element allows light to pass straight through from the input face to the output face. The two intermediate elements redirect light from beside the interior element in the input face to the ends of the interior element in the output face. The two exterior elements redirect light from beside the intermediate elements in the input face to the ends of the intermediate elements in the output face. The plural elements are made of planar blocks and prisms, and at least one planar block or prism included in one of the plural elements has an identical shape to at least one planar block or prism included in another of the plural elements.

By means of this arrangement, the image dissector can be constructed from a limited number of easily manufactured planar blocks and prisms, reducing manufacturing costs.

In another aspect, the invention is a relay and remapper for transforming a substantially rectangular-shaped band of light into a substantially arcuate band of light. The relay and remapper include a lens system and a parabolic mirror. The lens system has a highly curved field that distorts the substantially rectangular-shaped band of light into a curved image whose radius of curvature is the same as the substantially arcuate band of light. The parabolic mirror has a latus rectum that is approximately equal to a curvature of the substantially arcuate band of light and has a cross section at the latus rectum. The parabolic mirror is positioned at the curved image.

By means of this arrangement, a substantially rectangular-shaped band of light is remapped into a substantially arcuate band of light with minimal reduction of symmetry of pupil irradiance and distribution, uniformity of numerical aperture, and telecentricity of the light.

Preferably, the relay and remapper include an aperture stop positioned within the relay. The aperture stop is decentered from a common optical axis for the relay and remapper. By means of this arrangement, telecentricity and pupil symmetry for the substantially arcuate band of light are substantially maintained.

In another aspect, the invention is a relay and remapper for transforming a substantially rectangular-shaped band of light into a substantially arcuate band of light. The relay and remapper include a lens system and a curved mirror. The lens system imparts a curved image field to the substantially rectangular-shaped band of light. The curved mirror reflects light from the lens system into a substantially arcuate band with a substantially flat image field.

By means of this arrangement, a substantially rectangular-shaped band of light is remapped into a substantially arcuate band of light with minimal reduction of symmetry of pupil irradiance and distribution, uniformity of numerical aperture, and telecentricity of the light.

In another aspect, the invention is a reimager adaptable for use with a projection light source. The reimager includes plural mirrors, a lens system, and an aperture stop within the lens system. A light reflects off at least one of the plural mirrors and then passes through the lens system. In the lens system, the light is focused into a pupil image and passes through the aperture stop substantially at the pupil image. After passing through the lens system, the light reflects off at least another of the plural mirrors.

By means of this arrangement, the pupil size of the light is limited by the aperture stop as the light is reimaged. The limited pupil size results in increased symmetry of pupil irradiance.

Preferably, the light that is reimaged by the foregoing reimager is an arcuate band of light, and the reimager magnifies the arcuate band of light by 3.2 times. Furthermore, the aperture stop preferably closes on a smallest pupil diameter of the light. When used in a projection light source, this arrangement advantageously compensates for the distortion in pupil image caused by a remapper. In addition, this arrangement permits a projection light source to be constructed without a relay.

In another aspect, the invention is a method for integrating a light. A first dividing step divides the light in a first direction, the light being divided into multiple separate bands of light. A second dividing step divides the multiple separate bands of light in a second direction, the second direction being substantially orthogonal to the first direction, the multiple separate bands of light being divided into multiple separate beams of light. A summing step sums the multiple separate beams of light into a light that is nearly telecentric. Alternatively, the first dividing step and the second dividing step occur coextensively.

By means of this method, the multiple beams of light have small angular shifts that smear out the irradiance variations present in the exit pupil of the light. This smearing both increases the symmetry of pupil irradiance and distribution and increases the telecentricity of the light. These optical characteristics make the light more suitable for use with a ring field projector.

Preferably, in this method, dividing the light into multiple separate bands of light further includes dividing the light into a first set of bands that propagates in a first band direction substantially parallel to the light, a second set of bands that propagates at an angle to the first band direction, and a third set of bands that propagates at an opposite angle to the first band direction. Also, dividing the multiple separate bands into multiple separate beams of light further includes dividing each of the multiple separate bands into a first set of beams that propagates in a first beam direction, a second set of beams that propagates at an angle to the first beam direction, and a third set of beams that propagates at an opposite angle to the first beam direction. Additionally, the amount of light in the first set of bands approximately equals the sum of the amount of light in the second set of bands plus the amount of light in the third set of bands. Likewise, the amount of light in the first set of beams approximately equals the sum of the amount of light in the second set of beams plus the amount of light in the third set of beams. By means of this method, uniformity of irradiance and telecentricity of the sum of the beams of light is maximized.

In another aspect, the invention is a method for transforming an input light into a substantially rectangular-shaped band of light. Preferably, the input light is a substantially square-shaped band of light. A dissecting step dissects the input light into plural bands of light. A redirecting step redirects the plural bands into a substantially rectangular-shaped band of light. An attenuating step attenuates at least one of the plural bands so as to ensure approximately uniform irradiance of the substantially rectangular-shaped band of light.

By means of this method, an input light, which preferably is a substantially square-shaped band of light, is transformed into a substantially rectangular-shaped band of light without significant loss of telecentricity or of uniformity of irradiance.

Preferably, in this method, the attenuating step occurs coextensively with the dissecting step and the redirecting step. In addition, in the dissecting step, the input light preferably is dissected into an interior band, two intermediate bands, and two exterior bands. In the redirecting step, the interior band is redirected to a center of the substantially rectangular-shaped band of light, the two intermediate bands are redirected to ends of the interior band in the substantially rectangular-shaped band of light, and the two exterior bands are redirected to ends of the intermediate bands in the substantially rectangular-shaped band of light. Also, the interior band and the intermediate bands are attenuated in the attenuating step.

By means of this method, telecentricity and uniformity of irradiance of the substantially rectangular-shaped band of light are increased.

In yet another aspect, the invention is a method for transforming a substantially rectangular-shaped band of light into a substantially arcuate band of light. A curved image field is imparted to the substantially rectangular-shaped band of light. The substantially rectangular-shaped band of light with the curved image field is reflected into a substantially arcuate band of light with a substantially flat image field.

By means of this method, a substantially rectangular-shaped band of light is remapped into a substantially arcuate band of light while substantially preserving symmetry of pupil irradiance and distribution, uniformity of numerical aperture, and telecentricity of the light.

In yet another aspect, the invention is a method for reimaging a light. The method includes the steps of reflecting the light off at least one mirror, passing the light through a lens system and an aperture stop within the lens system, and reflecting the light off at least another mirror. When the light is passed through the lens system, it is focused into a pupil image. The light passes through the aperture stop substantially at the pupil image.

By means of this method, the pupil size of the light is limited by the aperture stop as the light is reimaged. The limited pupil size results in increased symmetry of pupil irradiance.

Preferably, in this method, the light that is reimaged is an arcuate band of light, and the reimager magnifies the arcuate band of light by 3.2 times. Furthermore, when the light passes through the aperture stop, a pupil diameter of the light is restricted to a smallest pupil diameter of the light before passing through the aperture stop. This method advantageously can compensate for the distortion in pupil images caused by a remapper.

This brief summary has been provided so that the nature of the invention may be understood quickly. A more complete understanding of the invention can be obtained by reference to the following detailed description of the preferred embodiments thereof in connection with the attached drawings.

BRIEF DESCRIPTION OF THE DRAWINGS

FIGS. 7a through 7c are graphs showing pupil uniformity at an output face of a fore-integrator.

FIG. 7a is a graph showing pupil uniformity at the center of an output face of a fore-integrator.

FIG. 7b is a graph showing pupil uniformity half-way between the center and an edge of an output face of a fore-integrator.

FIG. 7c is a graph showing pupil uniformity at an edge of an output face of a fore-integrator.

FIG. 8a is a view of two faces of an angular integrator.

FIG. 8b is a profile view of an edge of one face of an angular integrator.

FIG. 8c is a view of an angular integrator made from a slab of substantially transparent material.

FIG. 8d is a profile view of an edge of one face of a preferred embodiment of an angular integrator, drawn to scale.

FIG. 8e is a view of a preferred embodiment of an angular integrator made from a slab of substantially transparent material, drawn to scale.

FIG. 10a is a view of an image dissector.

FIG. 10b is a view of three types of elements that preferentially are combined so as to form the image dissector of FIG. 10a.

FIG. 10c is a view of the five different shapes of material that preferentially are combined so as to form the elements of FIG. 10b.

FIG. 11 is a view illustrating an operation of an image dissector.

FIG. 13a is a graph showing relative irradiance at an output face of a post-integrator according to the preferred embodiment.

FIG. 13b is a graph showing relative irradiance at an output face of a post-integrator in a case where the projection light source does not include an angular integrator.

FIG. 14a is a graph showing pupil uniformity at the center of an output face of a post-integrator according to the preferred embodiment.

FIG. 14b is a graph showing pupil uniformity half-way between the center and an edge of an output face of a post-integrator according to the preferred embodiment.

FIG. 14c is a graph showing pupil uniformity at an edge of an output face of a post-integrator according to the preferred embodiment.

FIG. 14d is a graph showing pupil uniformity at the center of an output face of a post-integrator in a case where the projection light source does not include an angular integrator.

FIG. 14e is a graph showing pupil uniformity half-way between the center and an edge of an output face of a post-integrator in a case where the projection light source does not include an angular integrator.

FIG. 14f is a graph showing pupil uniformity at an edge of an output face of a post-integrator in a case where the projection light source does not include an angular integrator.

DETAILED DESCRIPTION OF THE PREFERRED EMBODIMENT

Figure 1:
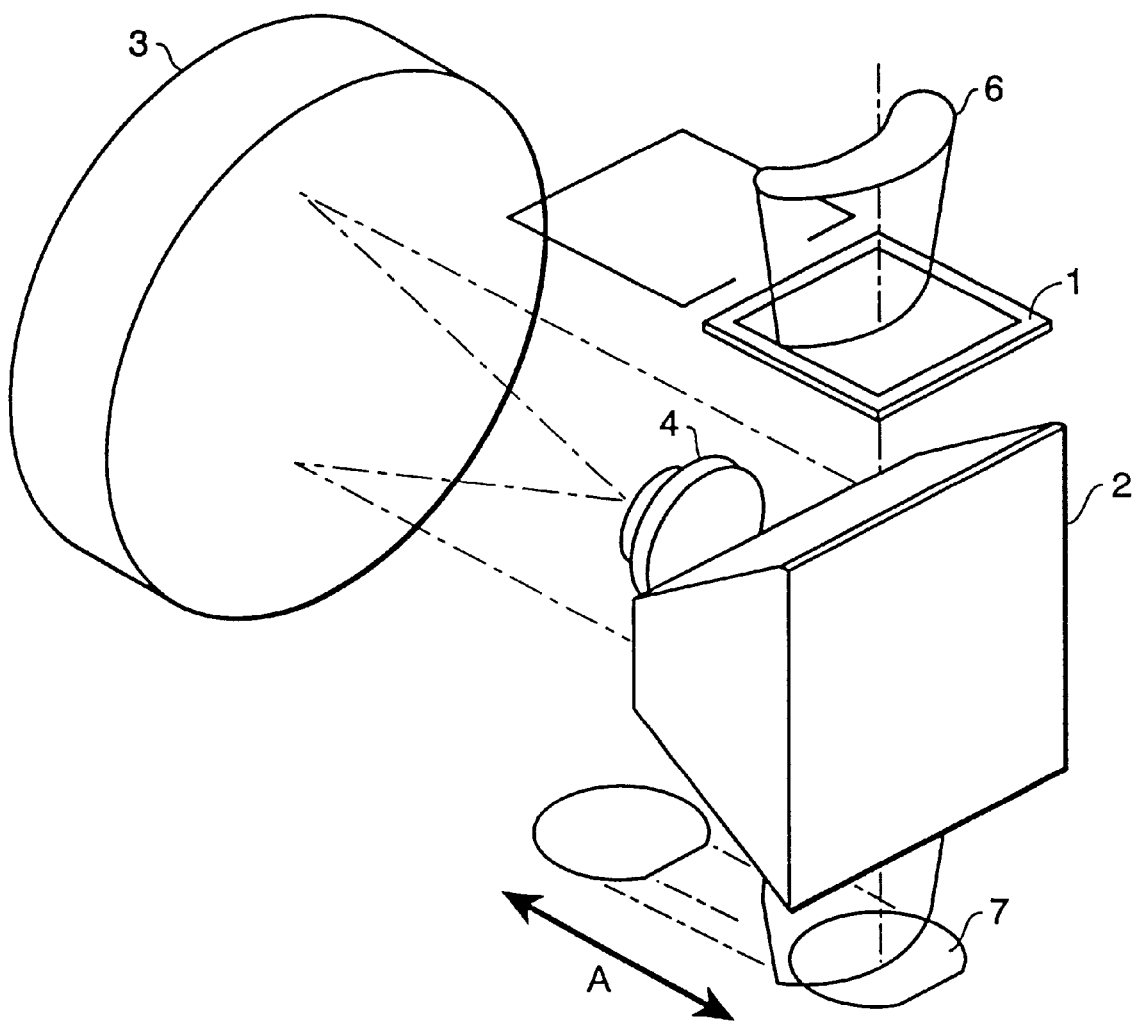
FIG. 1 is a view of a schematic representation of a conventional ring field projector.
Figure 2:
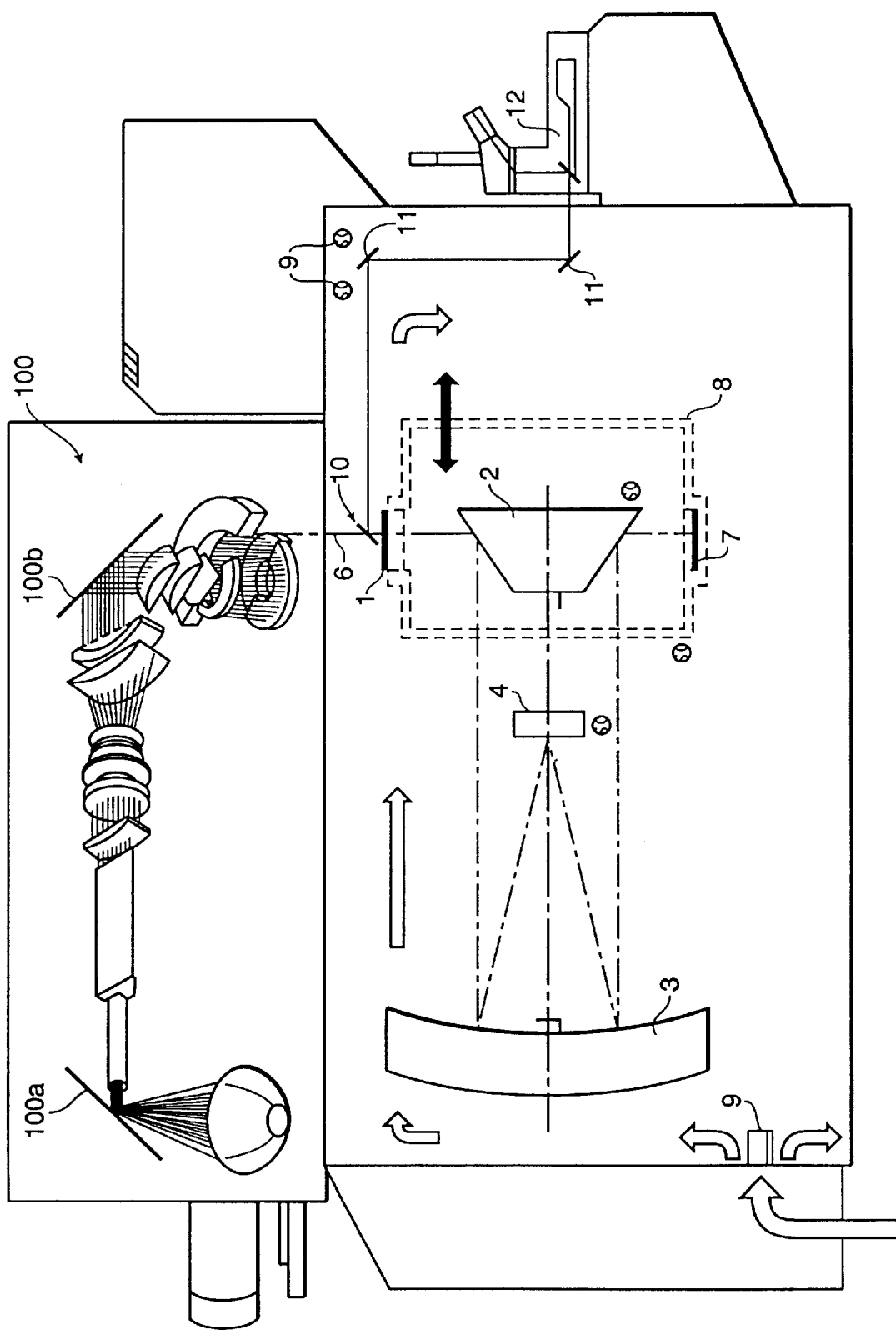
FIG. 2 is a view of a ring field projector incorporating a projection light source according to the invention.

FIG. 2 is a view of a ring field projector incorporating a projection light source according to the invention. An example of a ring field projector, which is a type of projector used in photolithography, is an Offner projector. Included in the ring field projector are reticle 1, trapezoidal mirror 2, concave mirror 3, convex mirror 4, target silicon 7, solid structure 8, fans 9, beam splitter 10, small mirrors 11, monitoring circuit 12, projection light source 100, and bending mirrors 100a and 100b.

Reticle 1 carries an image of one layer for a desired circuit pattern. Several of these layers make up a desired circuit pattern, which when properly developed on target silicon 7 forms a desired circuit. The photolithographic process is intended to develop this desired circuit on target silicon 7. Examples of circuits that can be created with this process are modern microprocessors, memory chips, solid-state switches, and the like.

Trapezoidal mirror 2, concave mirror 3, and convex mirror 4 form a ring field projection system. This projection system almost perfectly projects an image over a ring field that has a curvature matching a particular arc-shaped area of concave mirror 3. The parameters of the ring field projection system formed by these three mirrors, including the location and radius of this arc-shaped area, are well-known in the art.

Solid structure 8 holds reticle 1 and target silicon 7. Thus, reticle 1 and target silicon 7 are fixed with respect to each other. In other words, any movement of solid structure 8 results in a synchronous movement of reticle 1 and target silicon 7.

Fans 9 help maintain special environmental conditions in the projector such as typically are necessary for proper development of circuit patterns.

Beam splitter 10 splits-off a small part of arcuate band of light 6 after the arcuate band of light exits projection light source 100. This small part of arcuate band of light 6 is directed by mirrors 11 to monitoring circuit 12. The monitoring circuit monitors a shape and an irradiance of arcuate band of light 6, providing for either manual or automatic correction of projection light source 100 so as to ensure proper shape and irradiance of arcuate band of light 6.

Projection light source 100 generates arcuate band of light 6. The light from projection light source 100 has special optical characteristics that make arcuate band of light 6 suitable for use with a ring field projector. In addition, projection light source 100 generates a more intense arcuate band of light than conventional projection light sources.

Bending mirrors 100a and 100b are two mirrors placed at 45 degree angles to the optical path of projection light source 100. These mirrors serve to reduce the physical length of projection light source 100.

In operation, arcuate band of light 6 from projection light source 100 passes through reticle 1 and picks up an arc-shaped slice of the image on reticle 1. This arc-shaped slice is then projected onto target silicon 7 by means of the ring field projection system, which includes trapezoidal mirror 2, concave mirror 3, and convex mirror 4. An arcuate band of light is used in order to take advantage of the almost perfect projection possible with a ring field projector system.

Solid structure 8 synchronously moves reticle 1 and target silicon 7 in a direction parallel to arrow A. As solid structure 8 moves, arcuate band of light 6 is scanned across reticle 1. The resulting arc-shaped image of the layer of the circuit pattern on reticle 1 synchronously is scanned across target silicon 7.

After the image of the layer of the circuit pattern is scanned onto the silicon, subsequent processing develops the image on the silicon. The layer is then etched, doped, or otherwise processed, thereby creating one layer for the circuit pattern. In order to facilitate this process, special environmental conditions typically are maintained within the projector. Fans 9 help maintain these special conditions. In addition, monitoring circuit 12 can be used to adjust projection light source 100 so as to ensure proper shape and irradiance of the light, as needed.

As the layers of the circuit pattern are created on target silicon 7, the surface of the silicon becomes rough. Therefore, the projector must have a large depth of focus. In order to achieve this large depth of focus, the projector needs a projection light source that generates an arcuate band of light with symmetrical pupil irradiance, symmetrical pupil distribution, uniform numerical aperture, and a high degree of telecentricity. Projection light source 100 generates such a light.

Figure 3:
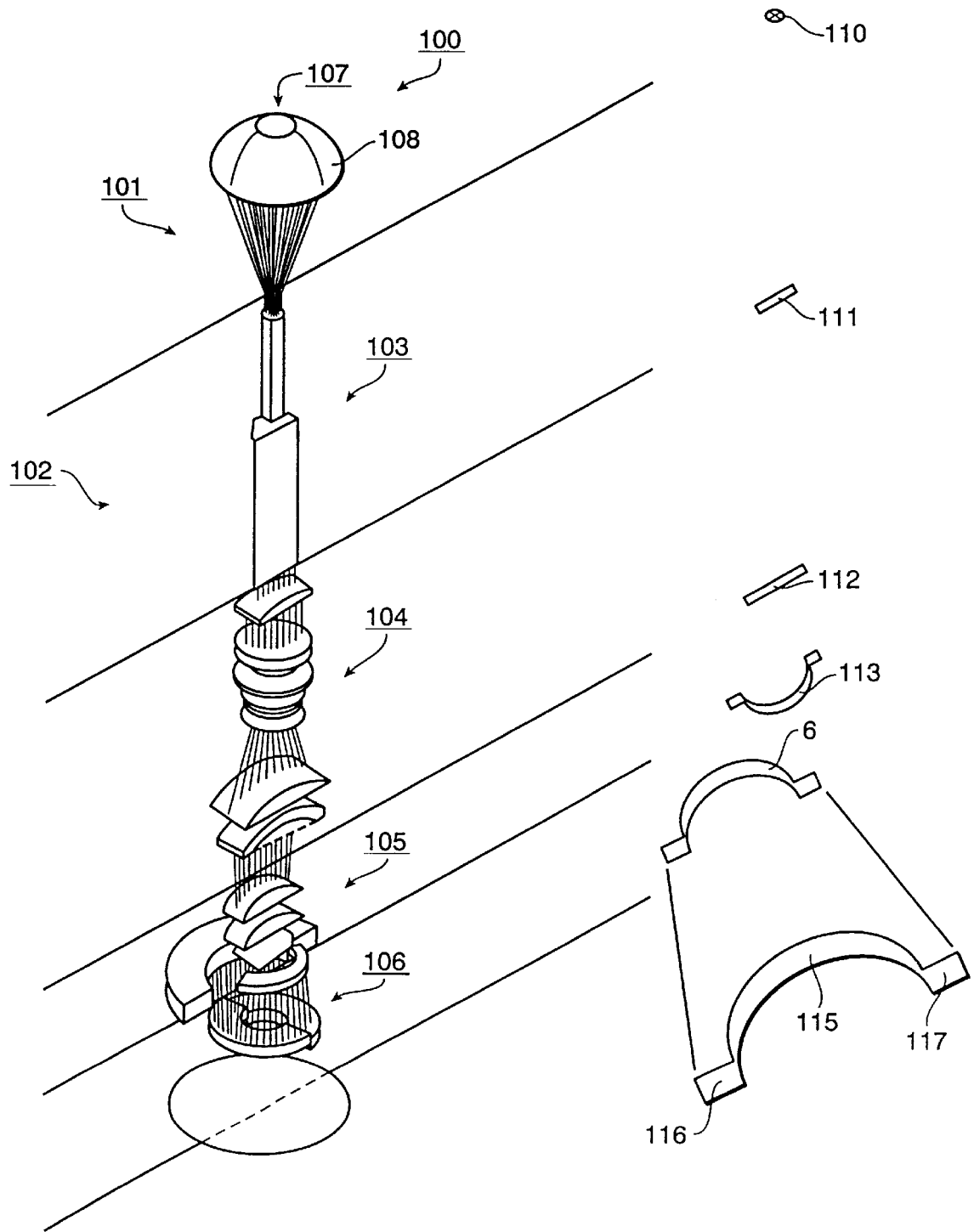
FIG. 3 is a view illustrating a structure and operation of a projection light source according to the invention.

FIG. 3 is a view illustrating a structure and operation of a projection light source according to the invention. Projection light source 100 includes lamp 101 and optical projection system 102.

Lamp 101 includes arc 107 and mirrors 108. Arc 107 is typically an arc from a mercury light source. Mirrors 108 form light from the arc into a rotationally-symmetric light 110, which forms an image at the input to optical projection system 102.

Optical projection system 102 includes homogenizer 103, relay 104, remapper 105, and reimager 106. Homogenizer 103 includes optical elements that form an input light into a substantially telecentric rectangular-shaped band of light. Relay 104 forms a 1.6 times magnified image from an input image without substantial loss of telecentricity. Remapper 105 remaps a rectangular-shaped band of light into a substantially telecentric arcuate band of light. Finally, reimager 106 creates a two-times magnified image from an input light.

In operation, homogenizer 103 receives rotationally-symmetric light 110 from lamp 101 and forms the light into substantially telecentric rectangular-shaped band of light 111. Relay 104 forms substantially telecentric rectangular-shaped band of light 111 into intermediate image 112 by magnifying band of light 111 by 1.6 times. Remapper 105 remaps intermediate image 112 into substantially telecentric arcuate band of light 113. Finally, reimager 106 magnifies arcuate band of light 113 by two times, resulting in arcuate band of light 6.

In the preferred embodiment, projection light source 100 generates arcuate band of light 6 with arc part 115 and tab parts 116 and 117. Arc part 115 is formed by two arcs with equal radii of curvature and offset centers. Arc part 115 is ideal for use with a ring field projector. The irradiance over tab parts 116 and 117 is less uniform and less telecentric than over arc part 115. Therefore, tab parts 116 and 117 are suitable for projection of circuit patterns or process control features requiring less detail and wider circuit lines than circuit patterns projected with arc part 115.

Figure 4:
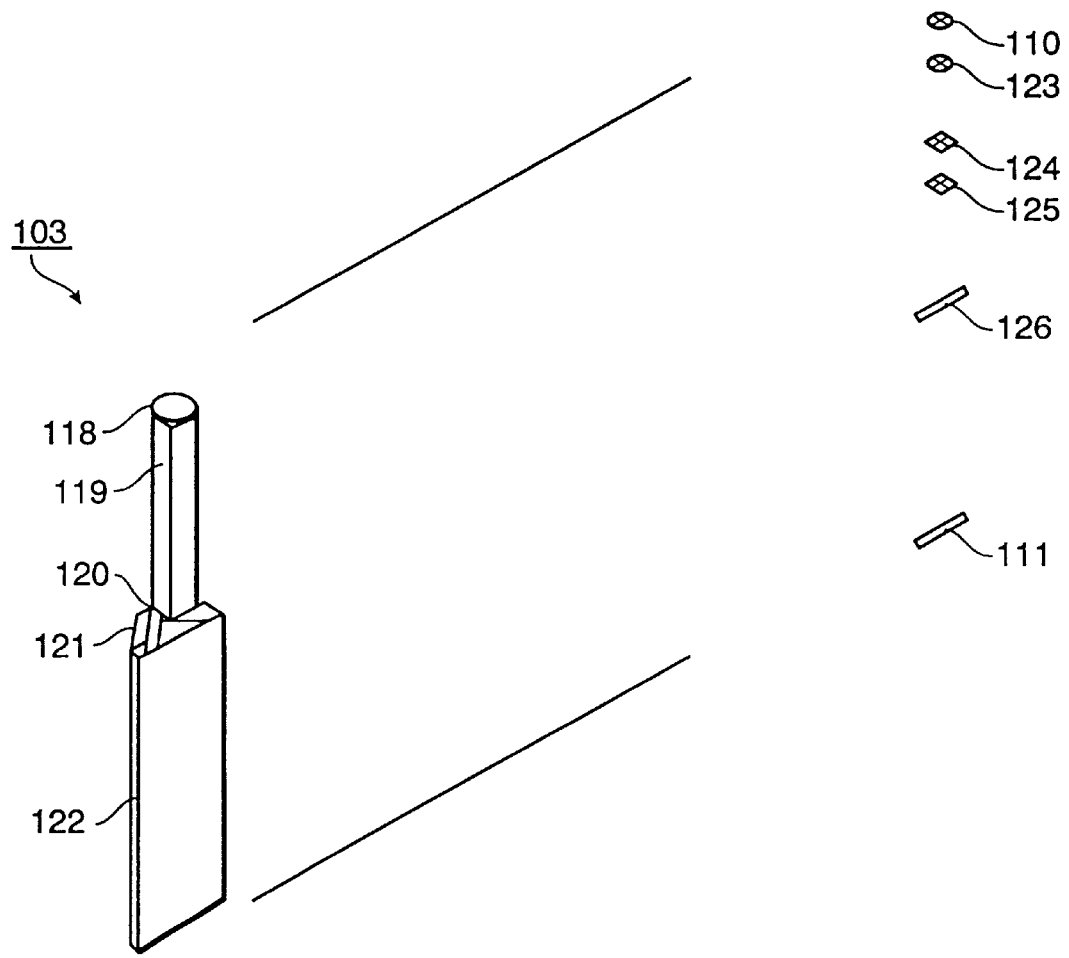
FIG. 4 is a view illustrating a structure and operation of a homogenizer, which comprises a field lens, a fore-integrator, an angular integrator, an image dissector and a post-integrator.

FIG. 4 is a view illustrating a structure and operation of a homogenizer. Homogenizer 103 includes field lens 118, fore-integrator 119, angular integrator 120, image dissector 121, and post-integrator 122.

Field lens 118 images the exit aperture of mirrors 108 at infinity. Fore-integrator 119 rearranges input light into a substantially telecentric square-shaped band of light. Angular integrator 120 increases the symmetry of pupil irradiance, symmetry of pupil distribution, and telecentricity of an input light. Image dissector 121 transforms an input square-shaped band of light into a rectangular-shaped band of light without substantial loss of telecentricity. Finally, post-integrator 122 redistributes input light so as to increase the uniformity of irradiance of the light.

In operation, field lens 118 is positioned at the entrance of homogenizer 103. Field lens 118 collimates the output aperture of lamp 101, forming rotationally-symmetric light 110 from lamp 101 into substantially telecentric circle of light 123. Fore-integrator 119 rearranges the energy in substantially telecentric circle of light 123 into square-shaped band of light 124. Angular integrator 120 increases the symmetry of pupil uniformity, symmetry of pupil distribution, and telecentricity of square-shaped band of light 124, resulting in substantially telecentric square-shaped band of light 125. Image dissector 121 transforms substantially telecentric square-shaped band of light 125 into substantially telecentric rectangular-shaped band of light 126. Post-integrator 122 compensates for any non-uniformity in substantially telecentric rectangular-shaped band of light 126, resulting in substantially telecentric rectangular-shaped band of light 111. This band of light is output from the post-integrator.

Now, the structure and operation of each element of homogenizer 103 is discussed in greater detail.

Field lens 118 is preferably a single plano-convex lens made from precision annealed optical glass (fused silica) with an index of refraction of 1.4585. The convex side of field lens 118 has a radius of 247.3 millimeters. The lens has an edge diameter of 40 millimeters and a central thickness of 4.0 millimeters. The optical surfaces of field lens 118 are polished and coated with an anti-reflection coating, ensuring a minimum transmittance per optical surface of 99.6% in the spectral range of 345 nm to 450 nm. This spectral range includes the range for light generated by a mercury lamp. The outer edges of field lens 118 are ground flat and blackened.

In operation, field lens 118 collimates the output aperture of lamp 101 by bending the light by an amount based on the lens' index of refraction and curvature. The light is bent to transform rotationally-symmetric light 110 from lamp 101 into substantially telecentric circle of light 123.

Figure 5:
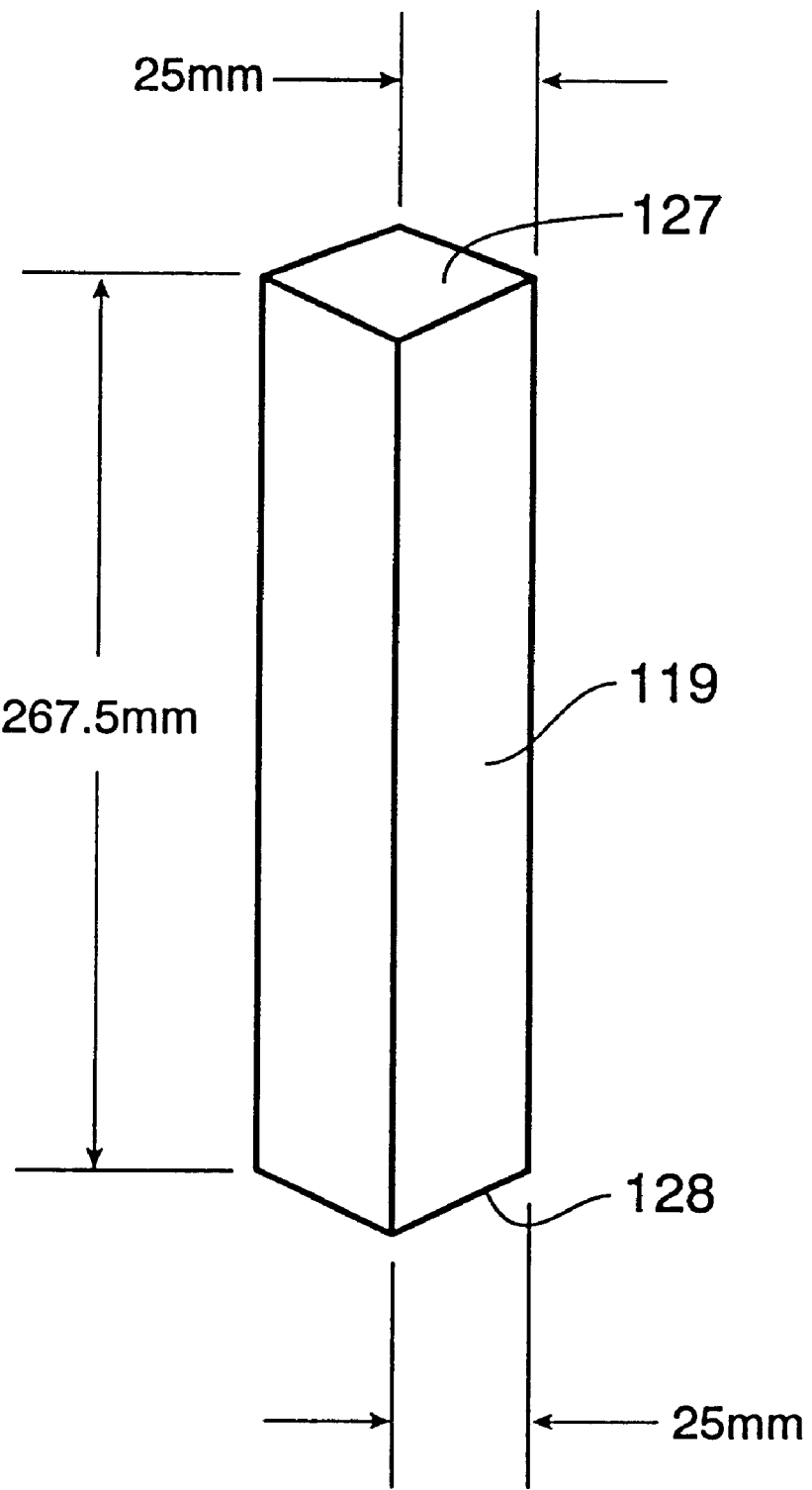
FIG. 5 is a view illustrating a structure of a fore-integrator.

FIG. 5 is a view illustrating a structure of fore-integrator 119. In the preferred embodiment, fore-integrator 119 is made from a single piece of UV grade fused silica measuring 25 millimeters by 25 millimeters by 267.5 millimeters. All faces of fore-integrator 119 are polished. In addition, input face 127 and output face 128 have anti-reflection coatings.

In operation, input face 127 of fore-integrator 119 receives substantially telecentric circle of light 123 from field lens 118. Fore-integrator 119 rearranges the energy in the light via multiple total internal reflections so that a nearly uniform irradiance is output through output face 128. The length of fore-integrator 119 is chosen so as to maximize the uniformity of this output irradiance. The nearly uniform irradiance of output face 128 forms square-shaped band of light 124.

Figure 6:
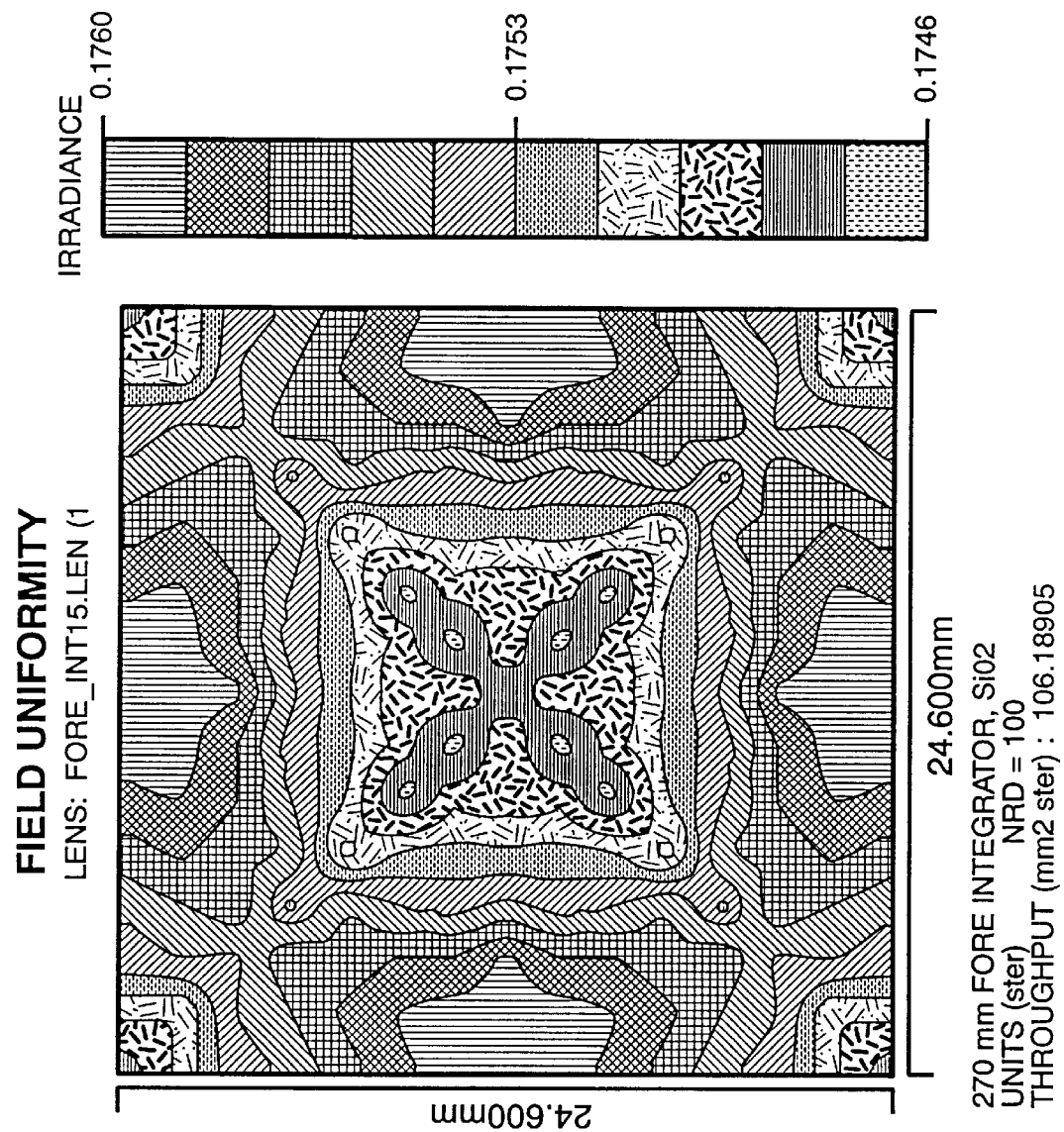
FIG. 6 is a graph showing relative irradiance at an output face of a fore-integrator.

FIG. 6 is a graph showing relative irradiance at output face 128 of fore-integrator 119. The horizontal and vertical axes correspond to position on output face 128. The shading corresponds to the irradiance of square-shaped band of light 124 at each position. The graph shows that irradiance of square-shaped band of light 124 at output face 128 is uniform to within ±0.4%.

Figure 7B:
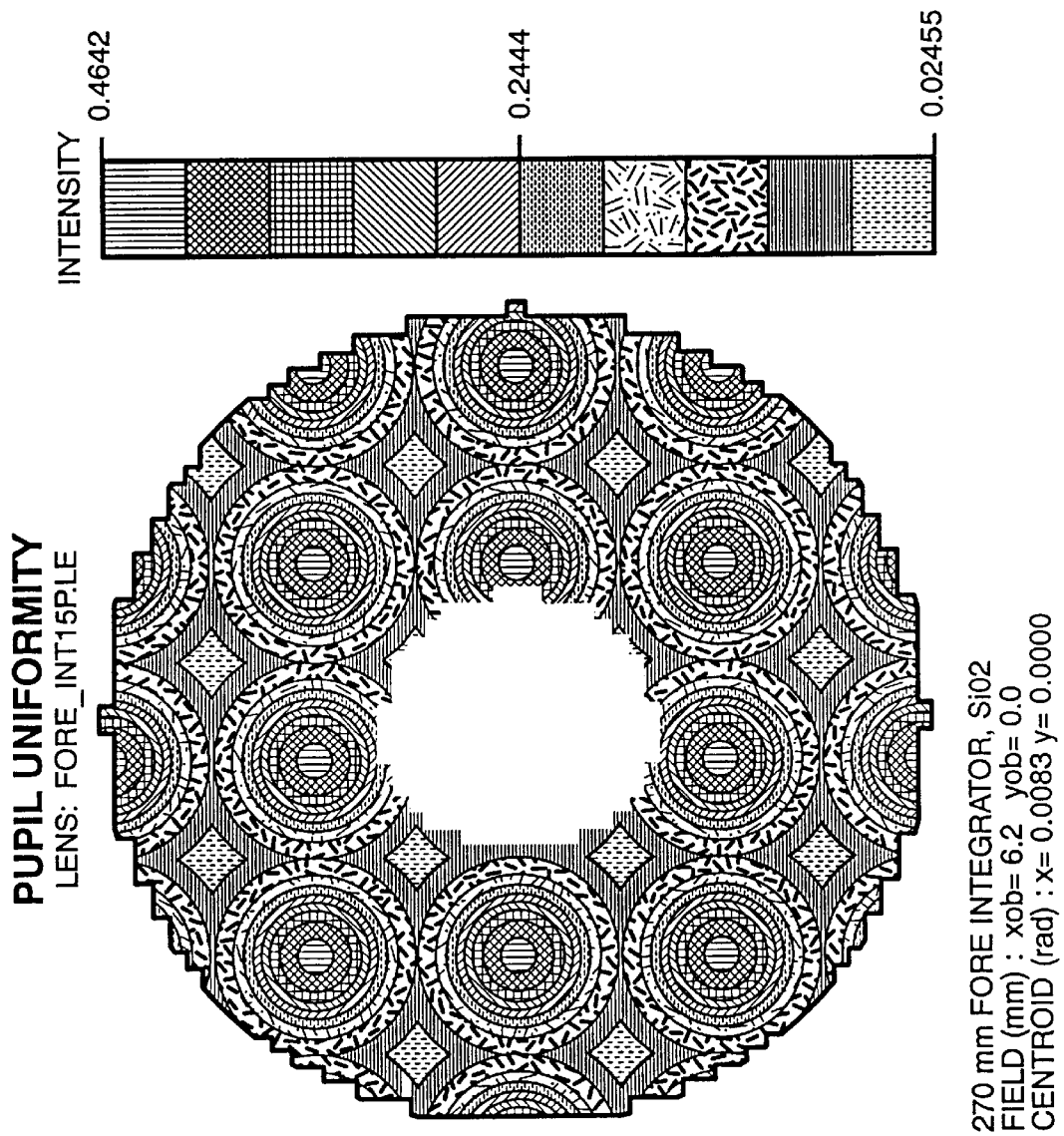
Figure 7C:
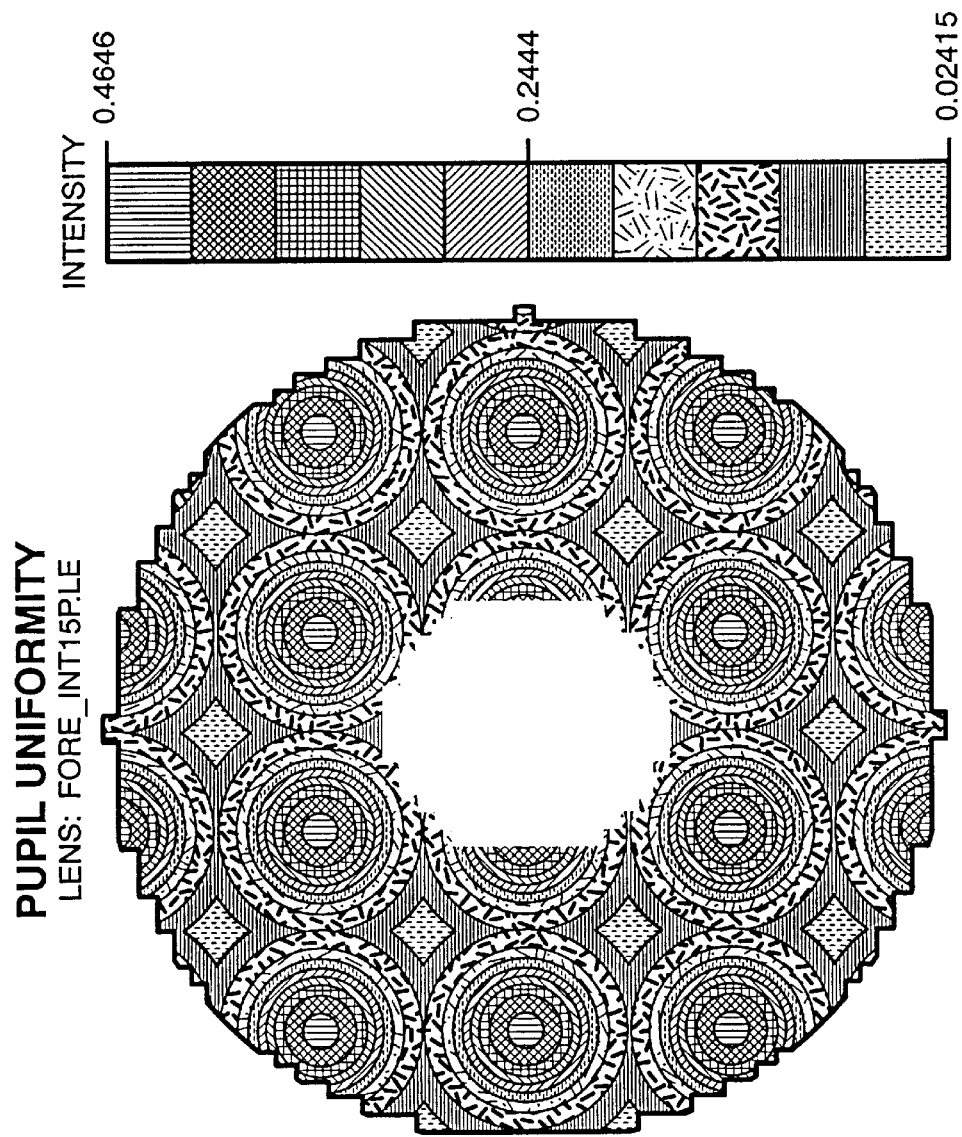

FIGS. 7a through 7c are graphs showing pupil uniformity at output face 128 of fore-integrator 119. FIG. 7a is a graph showing pupil uniformity at the center of output face 128. FIG. 7b is a graph showing pupil uniformity half-way between the center of output face 128 and an edge of output face 128. FIG. 7c is a graph showing pupil uniformity at an edge of output face 128.

In all three of FIGS. 7a, 7b and 7c, images of arc 107 are seen repeatedly across the pupil. In addition, the pattern of images shifts as the observation point moves from the center of output face 128 (FIG. 7a) to an edge of output face 128 (FIG. 7c). This shift indicates a lack of pupil symmetry and a lack of telecentricity. From only three observation points, it is not possible to determine the absolute maximum variation in telecentricity. However, from the observed degree of shift, a telecentricity error of ±8.3 milliradians is possible. The rest of the homogenizer, and in particular angular integrator 120, increase the pupil uniformity and the telecentricity of the light (i.e., telecentricity of the average light cone) to account for this error.

FIGS. 8a through 8e are views illustrating the structure of an angular integrator, which redistributes the light in the pupil to be more uniform.

Briefly, an angular integrator includes a first face, a second face, and a plurality of grooves longitudinally extending along the first face and the second face. In the preferred embodiment, the grooves are triangular grooves. The grooves are separated in the transverse direction by gaps. The grooves on the first face lie in a substantially orthogonal direction to the grooves on the second face, and light passes from the first face to the second face.

Figures 8, 8A:
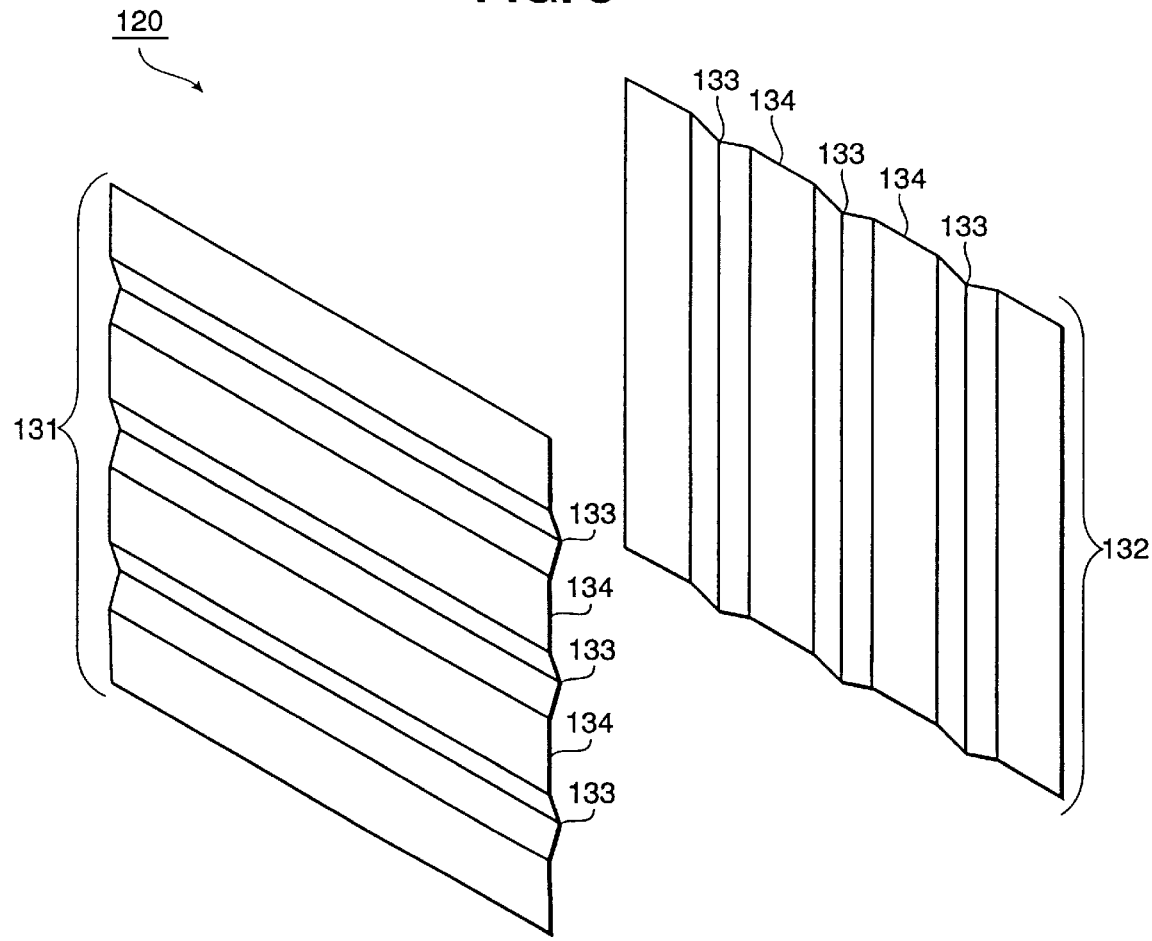
FIGS. 8a through 8e are views illustrating a structure of an angular integrator.

In more detail, FIG. 8a is a view of input face 131 and output face 132 for angular integrator 120. A plurality of triangular grooves 133 longitudinally extend along each face. Triangular grooves 133 are separated in the transverse direction by gaps 134. The triangular grooves on input face 131 lie in a substantially orthogonal direction to the triangular grooves on output face 132. Light passes from input face 131 to output face 132, passing through the triangular grooves and the gaps on each face.

Figure 8B:
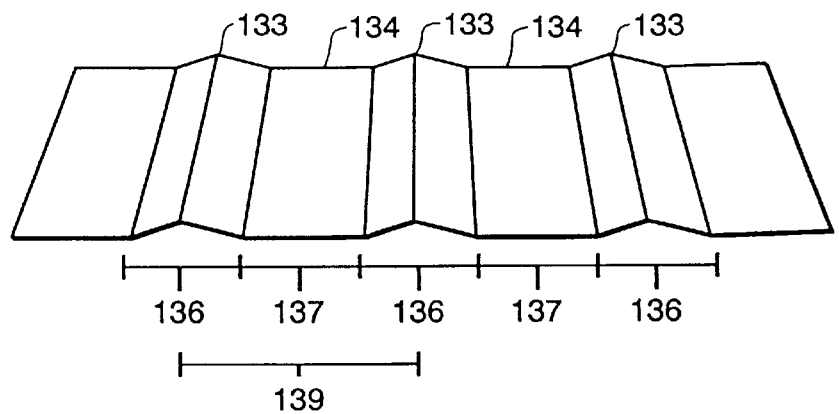

FIG. 8b is a profile view of an edge of one face of angular integrator 120. Preferably, width 136 of each of triangular grooves 133 is approximately equal to width 137 of each of gaps 134. In other words, period 139 of triangular grooves 133 is approximately twice width 137 of each of gaps 134.

Figure 8C:
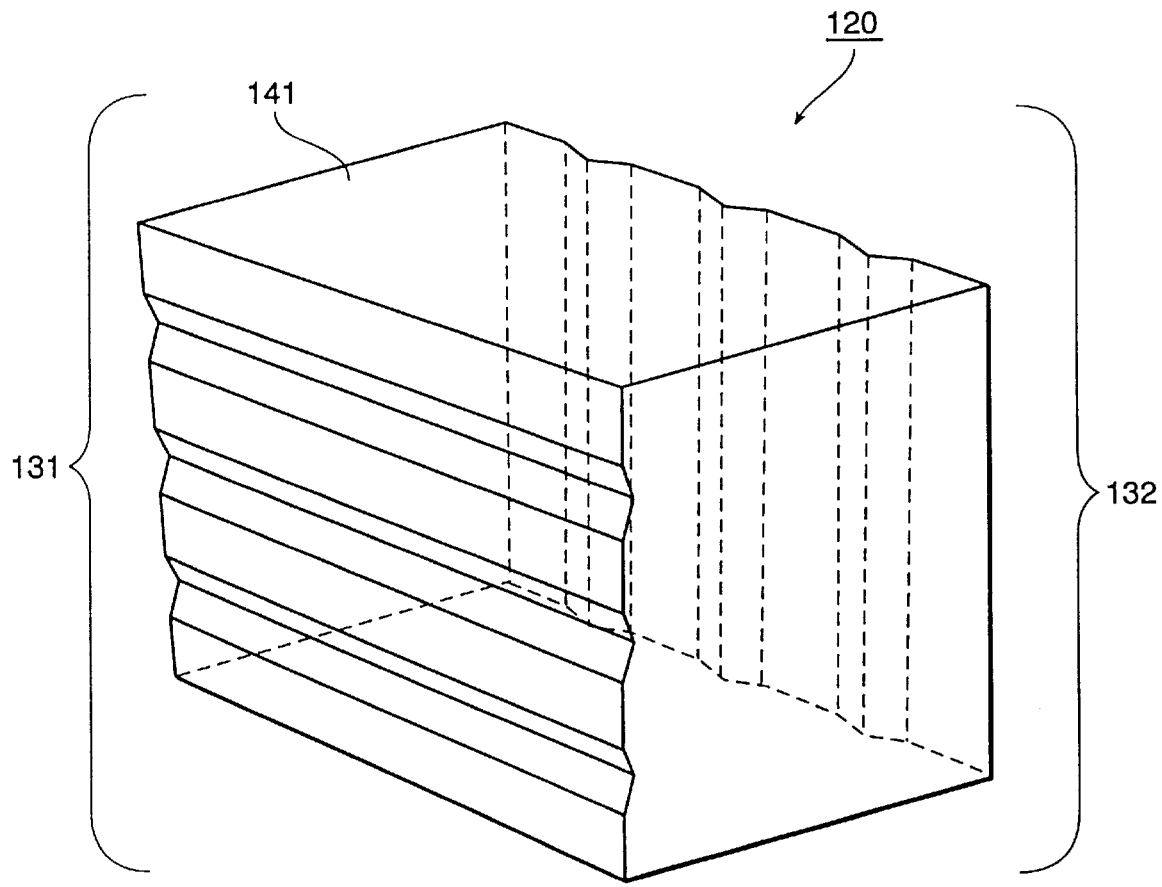

FIG. 8c is a view of angular integrator 120 made from a slab of substantially transparent material. Preferably, input face 131 and output face 132 are on opposite sides of slab of substantially transparent material 141. Alternatively, input face 131 and output face 132 can be formed on two boundaries between materials with different indices of refraction.

Figure 8D:
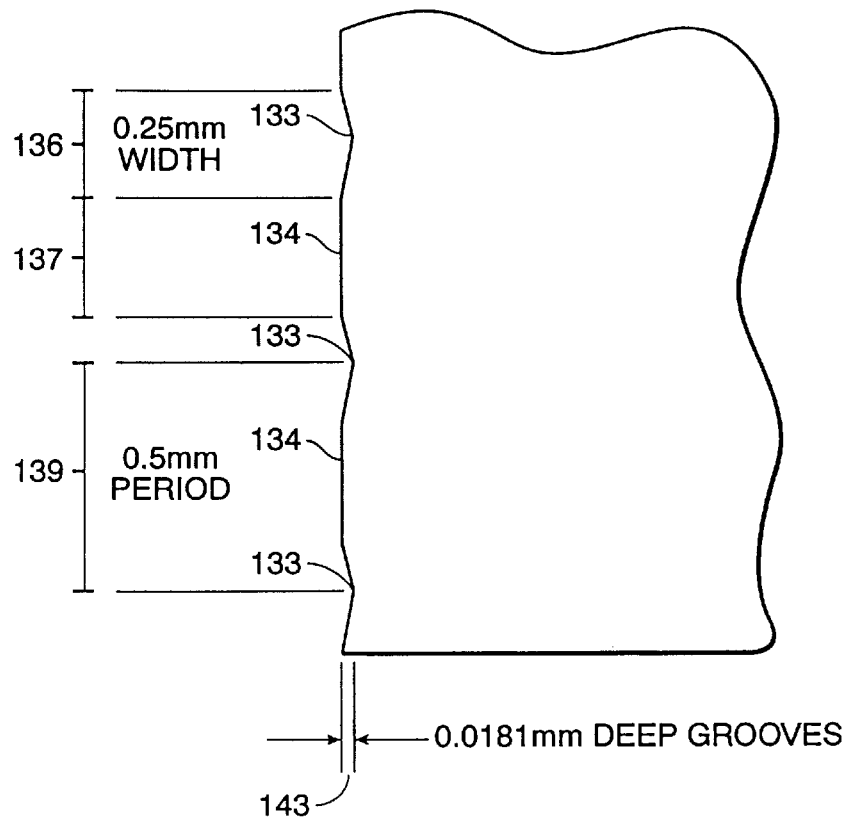

FIG. 8d is a profile view of an edge of one face of a preferred embodiment of angular integrator 120, drawn to scale. Preferably, a spacing and a size of triangular grooves 133 are large enough to substantially avoid diffractive effects. Thus, as shown in FIG. 8d, width 136 of each of grooves 133 and width 137 of each of gaps 134 are both 0.25 millimeters. Accordingly, period 139 of triangular grooves 133 is twice this width, or 0.50 millimeters. In addition, depth 143 of each of triangular grooves 133 is relatively shallow, in this case 0.0181 millimeters.

Figure 8E:
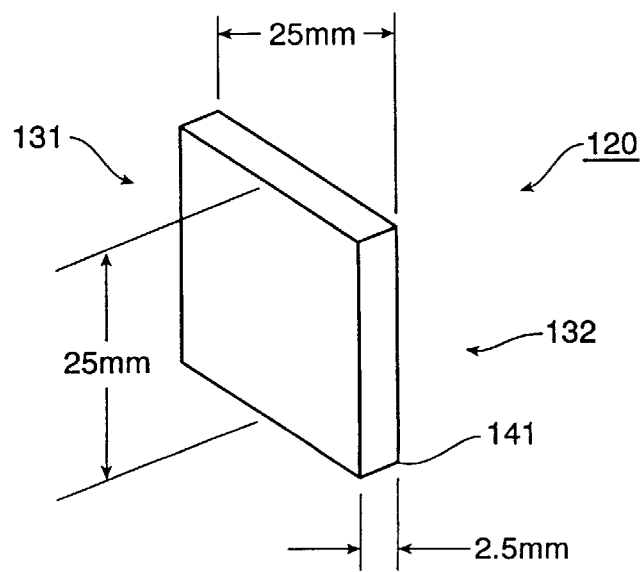

FIG. 8e is a view of a preferred embodiment of angular integrator 120 made from slab of substantially transparent material 141, drawn to scale. Note that grooves 133 and gaps 134 are not shown in FIG. 8e due to the relative smallness of these features at this scale. Preferably, slab of substantially transparent material 141 is made of UV grade fused silica. This material is used so that the angular integrator has a high optical transmission efficiency and is resistant to thermal loads. All faces of slab of substantially transparent material 141 are polished in order to minimize scattering. Finally, input face 131 and output face 132 both have anti-reflection coatings so as to maximize optical transmission efficiency.

In an alternative embodiment, triangular grooves 133 run at approximately a forty-five degree angle to a direction of repetition of pupil images in square-shaped band of light 124. As shown by FIGS. 7a through 7c, the direction of repetition of pupil images is horizontally or vertically across square-shaped band of light 124. Thus, in this alternative embodiment, triangular grooves 133 run diagonally across input face 131 and output face 132 of angular integrator 120.

Figure 8F:
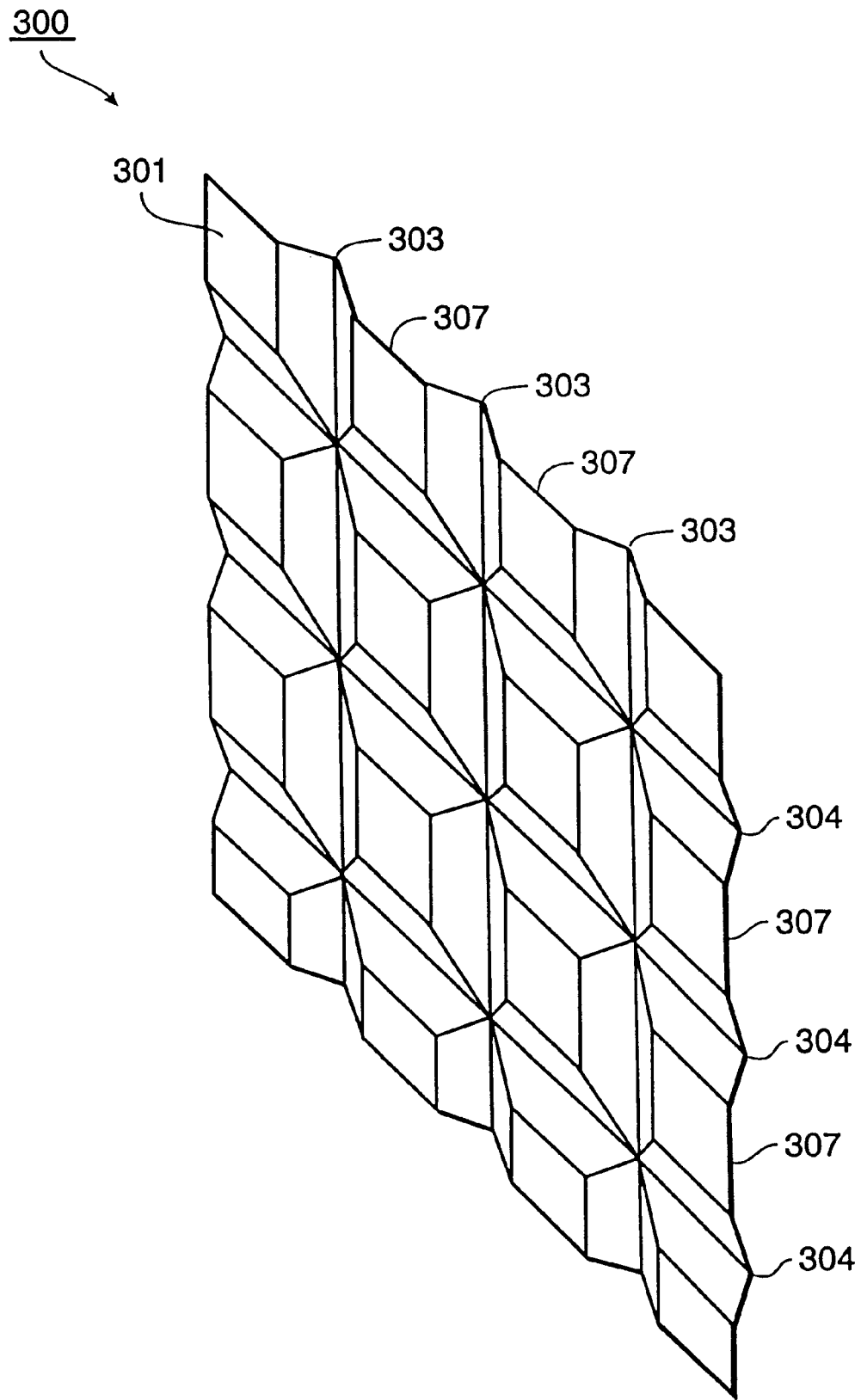
FIG. 8f is a view illustrating an alternative embodiment of an angular integrator.

FIG. 8f is a view of another alternative embodiment of an angular integrator. Angular integrator 300 includes a single face 301. Both a first set of grooves 303 and a second set of grooves 304 longitudinally extend along the face. Preferably, all of grooves 303 and 304 are triangular grooves. The grooves are separated in the transverse direction by gaps 307. Grooves 303 in the first set lie in a substantially orthogonal direction to grooves 304 in the second set. Preferably, face 301 is on a slab of substantially transparent material such as UV grade fused silica.

Briefly, in operation, the preferred embodiment of an angular integrator first divides an input light in a first direction, the input light being divided into multiple separate bands of light. The angular integrator then divides the multiple separate bands of light in a second direction, the second direction being substantially orthogonal to the first direction, the multiple separate bands of light being divided into multiple separate beams of light. The multiple separate beams are summed into a light that is nearly telecentric.

Figure 9:
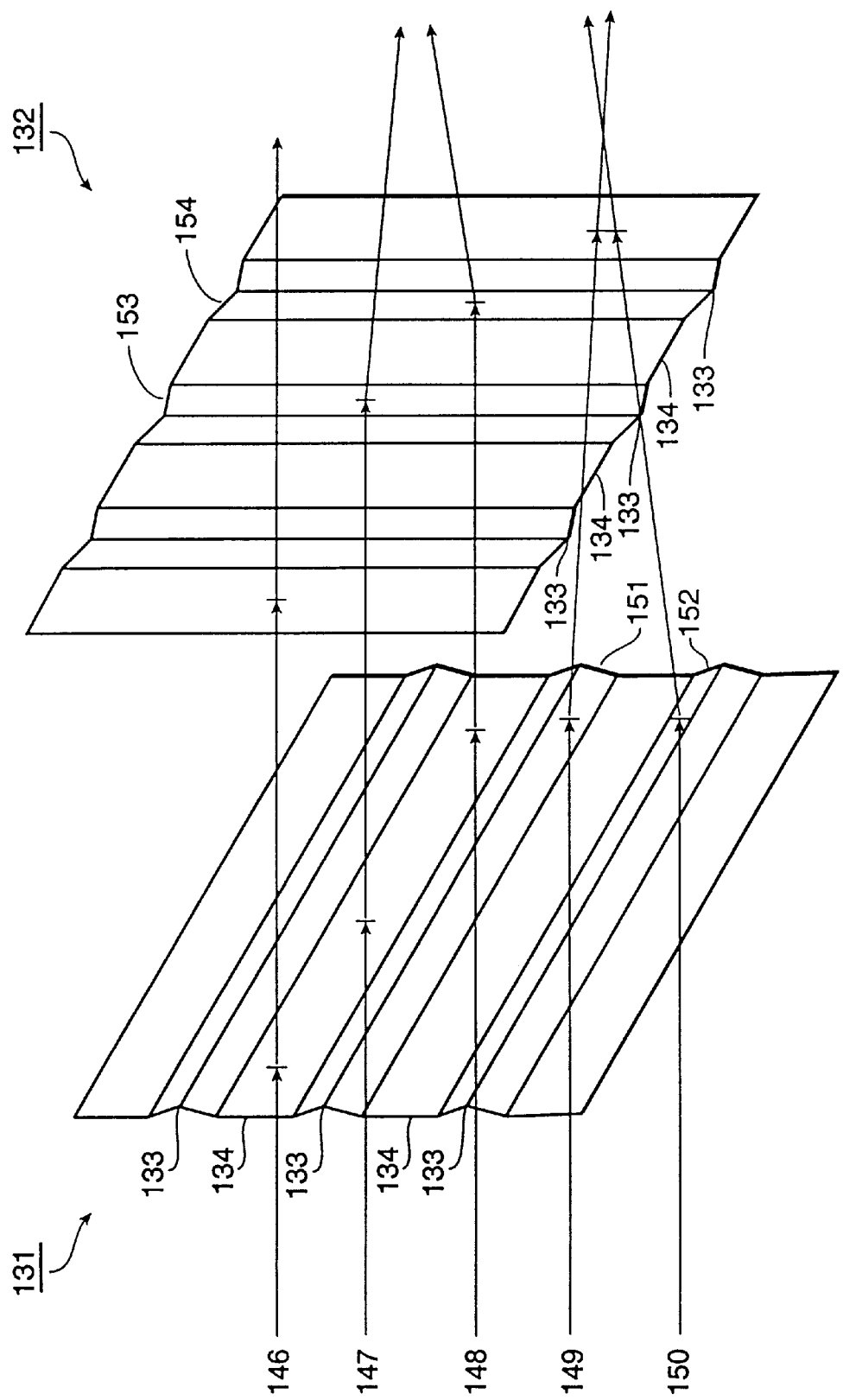
FIG. 9 is a view illustrating an operation of an angular integrator.

In more detail, FIG. 9 is a view illustrating an operation of angular integrator 120. It is assumed for discussion purposes only that input face 131 represents a boundary between an area with a lower index of refraction on the left and a higher index of refraction on the right, and that output face 132 represents a boundary between an area with a higher index of refraction on the left and a lower index of refraction on the right. These relationships between the indices of refraction determine the direction of refraction for a ray of light striking a part of one of the faces at an angle. The relationships match those that exist if input face 131 and output face 132 are formed on a slab of optical glass situated in an air environment.

Square-shaped band of light 124 enters angular integrator 120 through input face 131. In order to explain how square-shaped band of light 124 is transformed into substantially telecentric square-shaped band of light 125, rays 146 through 150 from square-shaped band of light 124 are traced through angular integrator 120. Note that these parallel rays are only five illustrative rays from the multitude of rays of light that actually strike input face 131 from various angles and directions. Parallel rays are used for this explanation solely for the sake of simplicity.

Initially, rays 146 through 150 of square-shaped band of light 124 are travelling in parallel. All of the rays strike input face 131. Rays 146 through 148 strike one of gaps 134 at a ninety degree angle and pass straight through input face 131. Ray 149 strikes bottom side 151 of one of triangular grooves 133 and is refracted downward. Ray 150 strikes top side 152 of one of triangular grooves 133 and is refracted upward. Thus, all rays travelling in parallel to rays 146 through 148 that strike the same one of gaps 134 form a band of light that passes straight through input face 131. All rays travelling parallel to ray 149 that strike side 151 form a band of light that is refracted downward by input face 131. Likewise, all rays travelling parallel to ray 150 that strike side 152 form a band of light that is refracted upward by input face 131.

Generalizing from these rays, input face 131 divides the input light into three sets of bands of light. The first set of bands propagates in a first band direction substantially parallel to the light, the second set of bands propagates at an angle to the first band direction, and the third set of bands propagates at an opposite angle to the first band direction.

Next, the multiple bands of light propagate across the distance between the faces of angular integrator 120 and strike output face 132. Tracing the illustrative rays, ray 146 strikes one of gaps 134 at a ninety degree angle and passes straight through output face 132. Ray 147 strikes right side 153 of one of triangular grooves 133 and is refracted to the right. Ray 148 strikes left side 154 of one of triangular grooves 133 and is refracted to the left. Thus, the band of light associated with rays 146 through 148 is divided into three beams of light by one of gaps 134 and one of triangular grooves 133 on output face 132. Likewise, the bands of light associated with each of rays 149 and 150 are divided into three beams of light by a gap and a triangular groove. Thus, the multiple bands of light are divided into multiple beams of light by output face 132.

Generalizing from these rays, output face 132 divides each of the separate bands of light into three separate sets of beams of light. The first set of beams propagates in a first beam direction, the second set of beams propagates at an angle to the first beam direction, and the third set of beams propagates at an opposite angle to the first beam direction.

Preferably, the amount of light in the first set of bands approximately equals a sum of an amount of light in the second set of bands plus an amount of light in the third set of bands. In addition, the amount of light in the first set of beams approximately equals a sum of an amount of light in the second set of beams plus an amount of light in the third set of beams. This is achieved by having width 136 of each of triangular grooves 133 approximately equal width 137 of each of gaps 134.

As the multiple beams of light propagate away from output face 132, they immediately combine. This combination sums the beams of light into a light that is nearly telecentric, smearing out the irradiance variations present in the exit pupil of the light. Thus, substantially telecentric square-shaped band of light 125 is output through output face 132 of angular integrator 120.

In the alternative embodiment illustrated in FIG. 8f, the operation is substantially the same as described above except that square-shaped bar of light 124 is directly divided into multiple beams of light by face 301. In other words, the steps of dividing the light into bands and of dividing the bands into beams occur coextensively.

By means of the foregoing, an angular integrator transforms square-shaped band of light 124 into a substantially telecentric square-shaped band of light 125, greatly increasing the symmetry of pupil irradiance, symmetry of pupil distribution, uniformity of numerical aperture, and telecentricity of the light.

Figures 10, 10A:
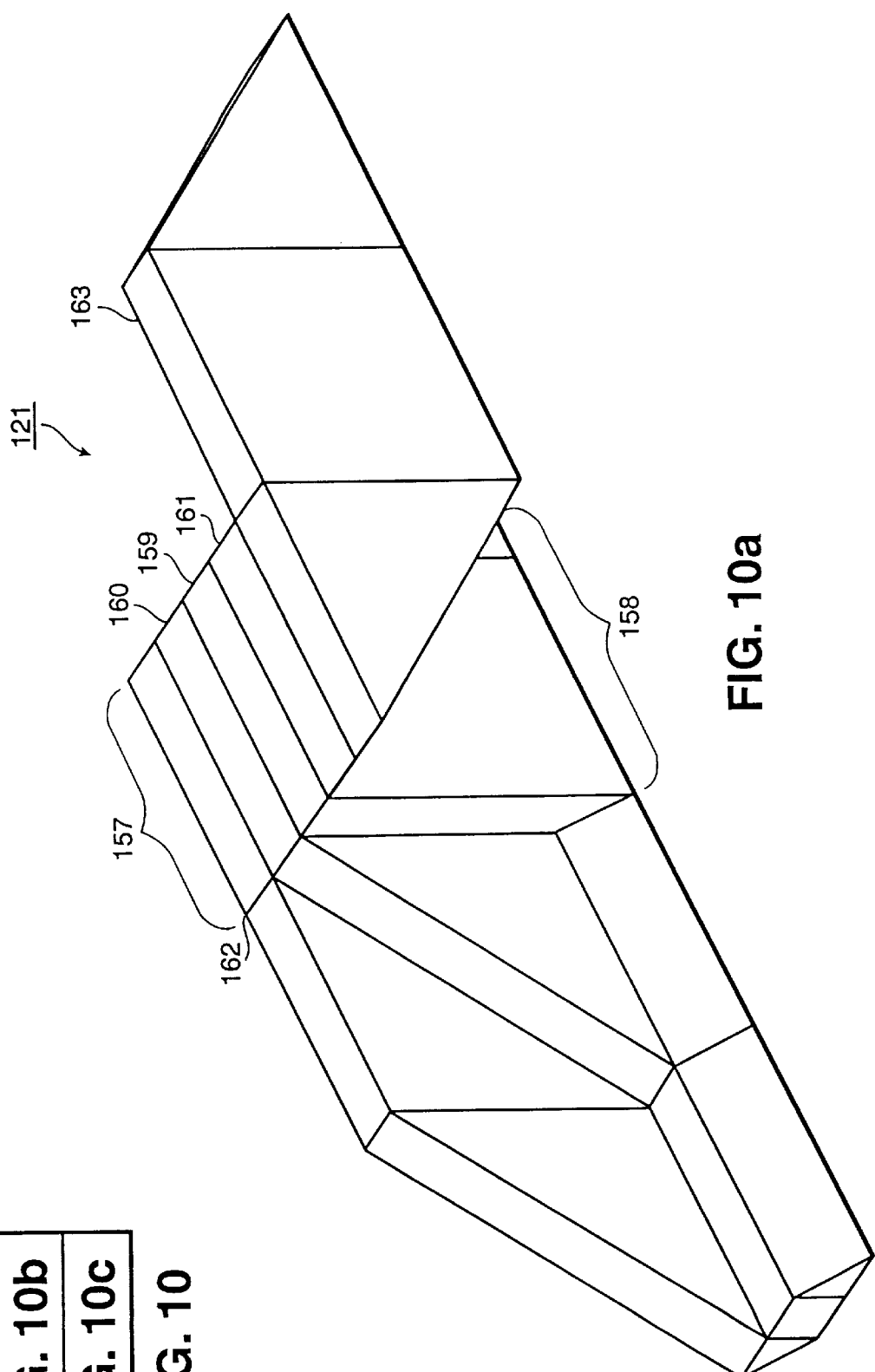
FIGS. 10a through 10c are views illustrating a structure of an image dissector.
Figure 10B:
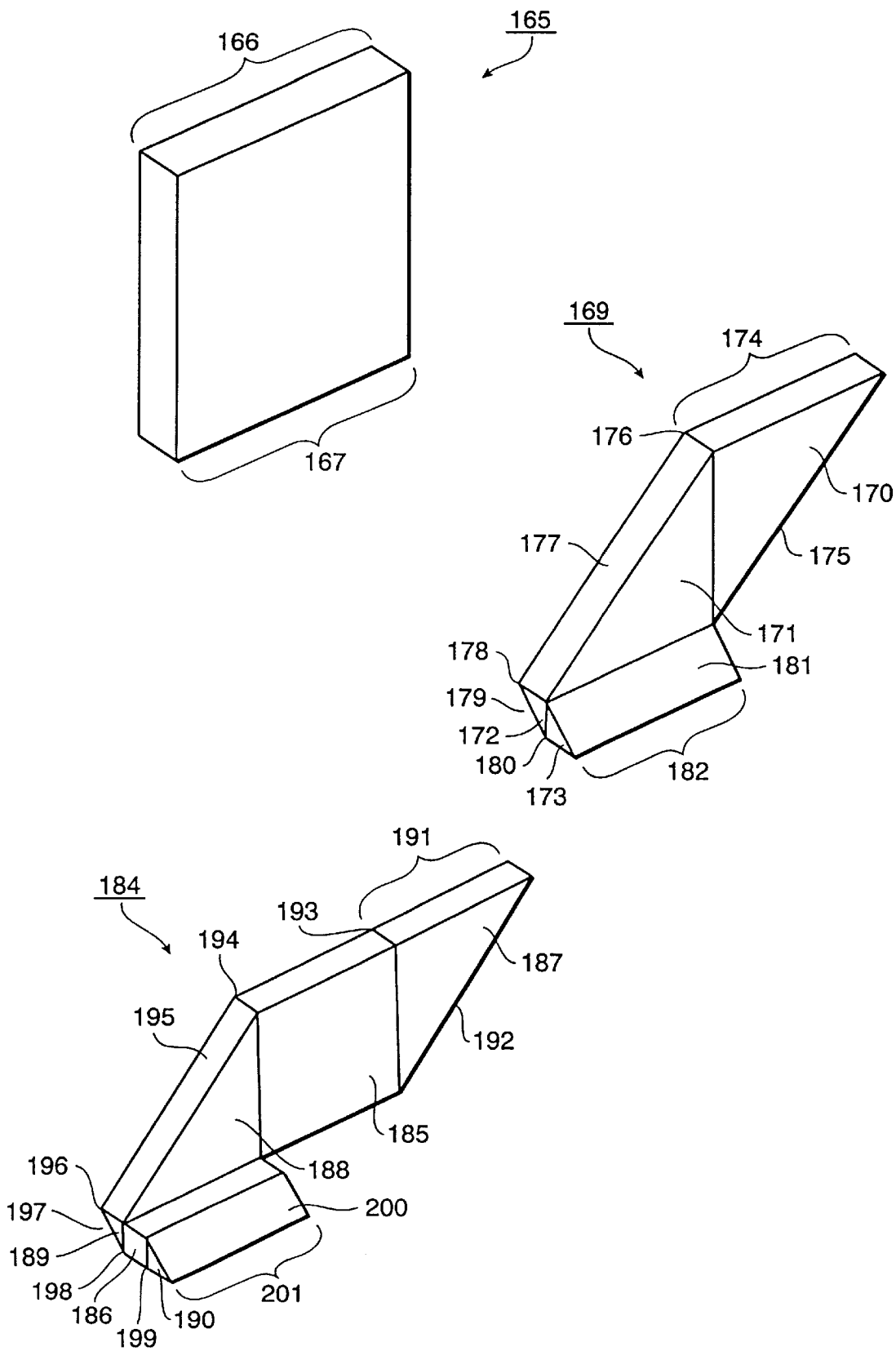
Figure 10C:
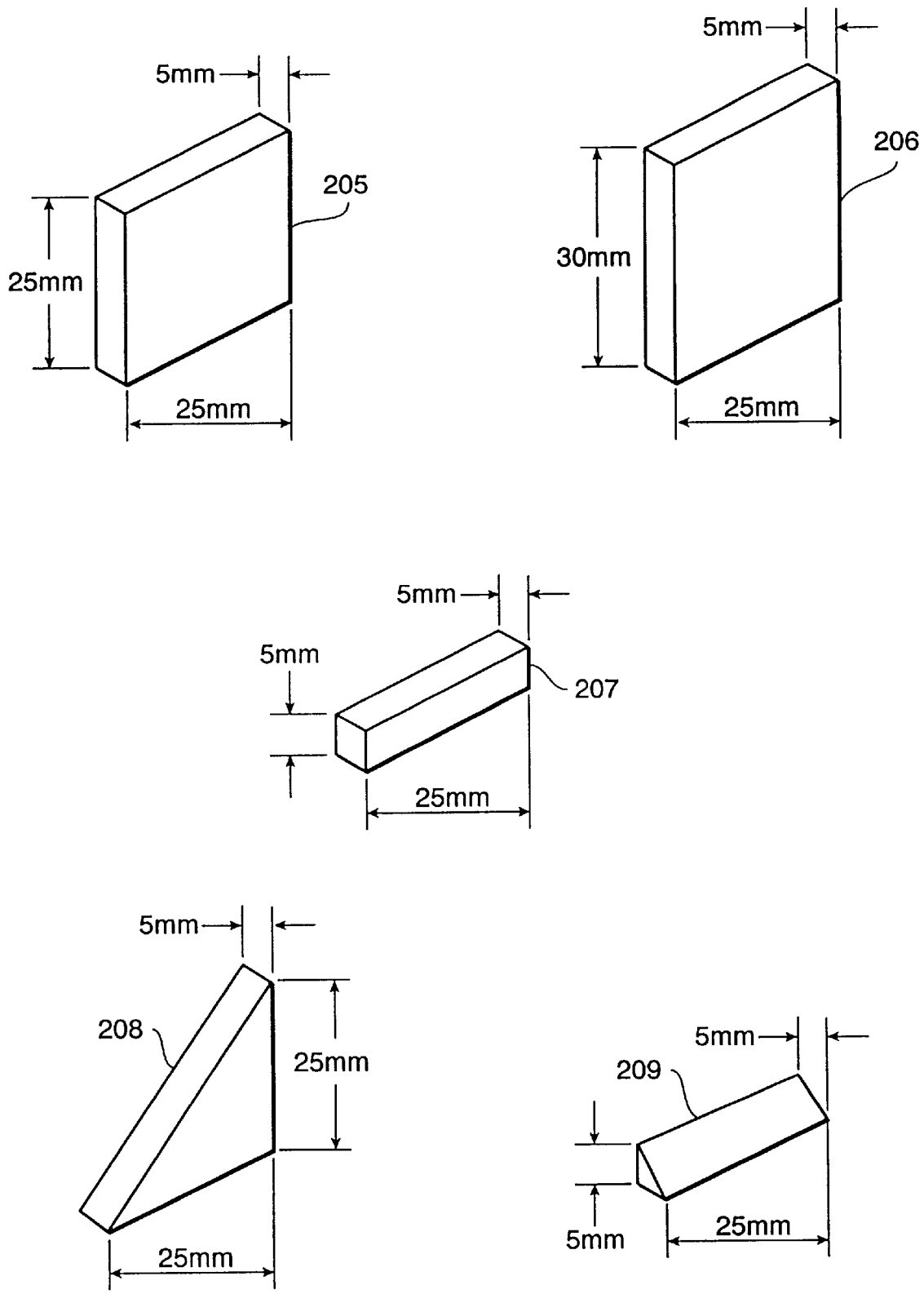

Image dissector 121 transforms substantially telecentric square-shaped band of light 125 into substantially telecentric rectangular-shaped band of light 126. FIGS. 10a through 10c are views illustrating a structure of an image dissector.

Briefly, an image dissector includes an input, an output face, and plural elements that redirect light from the input face to the output face. The output face has a substantially rectangular shape that is different than that of the input face. Preferably, the input face has a substantially square shape. At least one of the plural elements has at least one coating that reduces optical transmission efficiency of the element so as to ensure approximately uniform irradiance of the output face.

FIG. 10a is a view of an image dissector. Light enters image dissector 121 through input face 157 and exits through output face 158.

Preferably, as shown in FIG. 10a, the image dissector includes interior element 159, intermediate elements 160 and 161, and exterior elements 162 and 163. Interior element 159 allows light to pass straight through from input face 157 to output face 158. Intermediate elements 160 and 161 redirect light from beside interior element 159 in input face 157 to the ends of interior element 159 in output face 158. Exterior elements 162 and 163 redirect light from beside intermediate elements 160 and 161 in input face 157 to the ends of intermediate elements 160 and 161 in output face 158. Note that in alternative embodiments, a different number of elements (e.g., 3 or 7) could be used to form an image dissector.

Preferably, intermediate elements 160 and 161 are identical types of elements. In other words, intermediate elements 160 and 161 have identical shapes and optical characteristics. Likewise, exterior elements 162 and 163 are identical types of elements. Thus, image dissector 121 is preferably made from only three types of elements: interior-type elements, intermediate-type elements, and exterior-type elements.

FIG. 10b is a view of the three types of elements that preferably are combined so as to form the image dissector of FIG. 10a.

Interior-type element 165 has a rectangular shape. Interior-type element 165 preferably is made from a single planar block of material. Light enters interior-type element 165 through input face 166 and exits through output face 167.

Intermediate-type element 169 has a more complicated shape than the interior-type element. Intermediate-type element 169 is made from triangular prisms 170 through 173. These prisms are all separated by small airspaces, and the junctions between the prisms form interior refractive surfaces that slightly degrade the optical transmission efficiency of the element.

Light enters intermediate-type element 169 through input face 174, reflects off face 175, passes through interior refractive surface 176, reflects off face 177, passes through interior refractive surface 178, reflects off face 179, passes through interior refractive surface 180, reflects off face 181, and exits through output face 182. The light also may undergo total internal reflections off any of the exterior faces of intermediate-type element 169 other than input face 174 and output face 182. However, these total internal reflections can be largely ignored because they occur with nearly 100% efficiency.

Exterior-type element 184 also has a more complicated shape than the interior-type element. Exterior-type element 184 is made from planar blocks 185 and 186 and from prisms 187 through 190. These planar blocks and prisms are all separated by small airspaces, and the junctions between the planar blocks and prisms also form interior refractive surfaces that slightly degrade the optical transmission efficiency of the element.

Light enters exterior-type element 184 through input face 191, reflects off face 192, passes through interior refractive surfaces 193 and 194, reflects off face 195, passes through interior refractive surface 196, reflects off face 197, passes through interior refractive surfaces 198 and 199, reflects off face 200, and exits through output face 201. The light also may undergo total internal reflections off any of the exterior faces of exterior-type element 184 other than input face 191 and output face 201. However, these total internal reflections can be largely ignored because they occur with nearly 100% efficiency.

Generally, all of the interior refractive surfaces of intermediate-type element 169 and exterior-type element 184 have anti-reflection coatings. In addition, all of the reflective faces, namely faces 175, 177, 179, 181, 192, 195, 197, and 200, have enhanced aluminum reflective coatings. However, in order to equalize the optical transmission efficiency of the three types of elements, special coatings must be applied to some faces and surfaces of interior-type element 165 and intermediate-type element 169.

In more detail, exterior-type element 184 has the most faces and internal refractive surfaces. As a result, all other characteristics being equal, exterior-type element 184 has a lower optical transmission efficiency than interior-type element 165 and intermediate-type element 169. Likewise, intermediate-type element 169 has a lower optical transmission efficiency than interior-type element 165. For reasons that are explained below, these inequalities in optical transmission efficiency are not preferred.

In order to lower the optical transmission efficiency of interior-type element 165 to that of exterior-type element 184, input face 166 of interior-type element 165 has a coating that reduces the optical transmission efficiency of the face to 81%. This coatings is preferably partially reflective, as opposed to absorptive, due to the high light fluxes that pass through the elements. These high light fluxes would tend to degrade an absorptive coating. Output face 167 has a standard anti-reflection coating, giving that face a standard optical transmission efficiency of 99.6%. With these coatings, the optical transmission efficiency of interior-type element 165 matches that of exterior-type element 184.

In a similar manner, one refractive surface in intermediate-type element 169, such as interior refractive surface 176, has an anti-reflection coating with an optical transmission efficiency of only 97.2%, as opposed to the standard 99.6%. With this coating and the other standard coatings described above, the optical transmission efficiency of intermediate-type element 169 matches that of exterior-type element 184.

By means of this arrangement, the light exiting output face 158 of image dissector 121 is advantageously nearly uniform.

In the preferred embodiment, many of the planar blocks and prisms that form the elements have identical shapes. For example, prisms 170, 171, 187 and 188 all have identical shapes. Thus, the three types of element that form image dissector 121 are in turn made of a limited number of simple planar blocks and prisms.

FIG. 10c is a view of the five different shapes of material that preferentially are combined so as to form the elements of FIG. 10b. These five different shapes of materials include planar block 205, planar block 206, planar block 207, triangular prism 208, and triangular prism 209.

Planar block 205 measures 5 millimeters by 25 millimeters by 25 millimeters and forms planar block 185 of exterior-type element 184. Planar block 206 measures 5 millimeters by 30 millimeters by 25 millimeters and forms interior-type element 165. Planar block 207 measures 5 millimeters by 5 millimeters by 25 millimeters and forms planar block 186 of exterior-type element 184. Triangular prism 208 measures 5 millimeters by 25 millimeters by 25 millimeters and forms triangular prisms 170, 171, 187, and 188. Finally, triangular prism 209 measures 5 millimeters by 5 millimeters by 25 millimeters and forms triangular prisms 172, 173, 189, and 190.

Planar blocks 205 through 207 and triangular prisms 208 and 209 are preferably made from UV grade fused silica so as to provide good resistance to thermal loads. In addition, every face of the blocks and prisms are preferably polished so as to minimize scattering.

By means of this construction, image dissector 121 is made from a limited number of easily manufactured planar blocks and prisms, reducing the cost of manufacturing the image dissector.

The operation of image dissector 121 in transforming substantially telecentric square-shaped band of light 125 into substantially telecentric rectangular-shaped band of light 126 is now discussed.

Briefly, the input light, which is preferably a substantially square-shaped band of light, is dissected into plural bands of light. Then, the plural bands of light are redirected into a substantially rectangular-shaped band of light. At least one of the plural bands of light is attenuated so as to ensure approximately uniform irradiance of the substantially rectangular-shaped band of light.

FIG. 11 is a view illustrating an operation of image dissector 121. Substantially square-shaped band of light 125 enters image dissector 121 through input face 157. The square-shaped band of light is then dissected into five bands of light, each band being dissected from the square-shaped band of light by one of the elements of the image dissector. Interior band 211 is dissected from the square-shaped band of light by interior element 159. Intermediate bands 212 and 213 are dissected from the square-shaped band of light by intermediate elements 160 and 161. Exterior bands 214 and 215 are dissected from the square-shaped band of light by exterior elements 162 and 163.

Each of the elements then redirects its corresponding band of light to a part of substantially rectangular-shaped band of light 126, arranging the bands end-to-end. Interior element 159 redirects interior band 211 to interior part 216 of the rectangular-shaped band of light. Intermediate elements 160 and 161 redirect intermediate bands 212 and 213 to intermediate parts 217 and 218 of the rectangular-shaped band of light, along the ends of interior part 216. Exterior elements 162 and 163 redirect exterior bands 214 and 215 to exterior parts 219 and 220 of the rectangular-shaped band of light, along the ends of intermediate parts 217 and 218.

As mentioned above, special coating are used to ensure that the optical transmission efficiency of the elements of image dissector 121 are substantially equal. These coatings attenuate the interior and intermediate bands of light coextensively with their dissection and redirection. Thus, substantially rectangular-shaped band of light 126 exits the image dissector with a nearly uniform irradiance.

By means of this structure and operation, and in particular by means of the coatings that attenuate the interior and intermediate bands of light, substantially square-shaped band of light 125 is transformed into substantially rectangular-shaped band of light 126 with a nearly uniform irradiance. This uniform irradiance is advantageous because a non-uniform irradiance of the rectangular-shaped band of light impairs the ability of the projection light source to generate a light with symmetric pupil irradiance.

Despite the special coatings, some non-uniformity may exist in substantially rectangular-shaped band of light 126, primarily due to manufacturing errors and dissector band separation caused by the small airspaces separating the planar blocks and prisms. Post-integrator 122 compensates for this non-uniformity.

Figure 12:
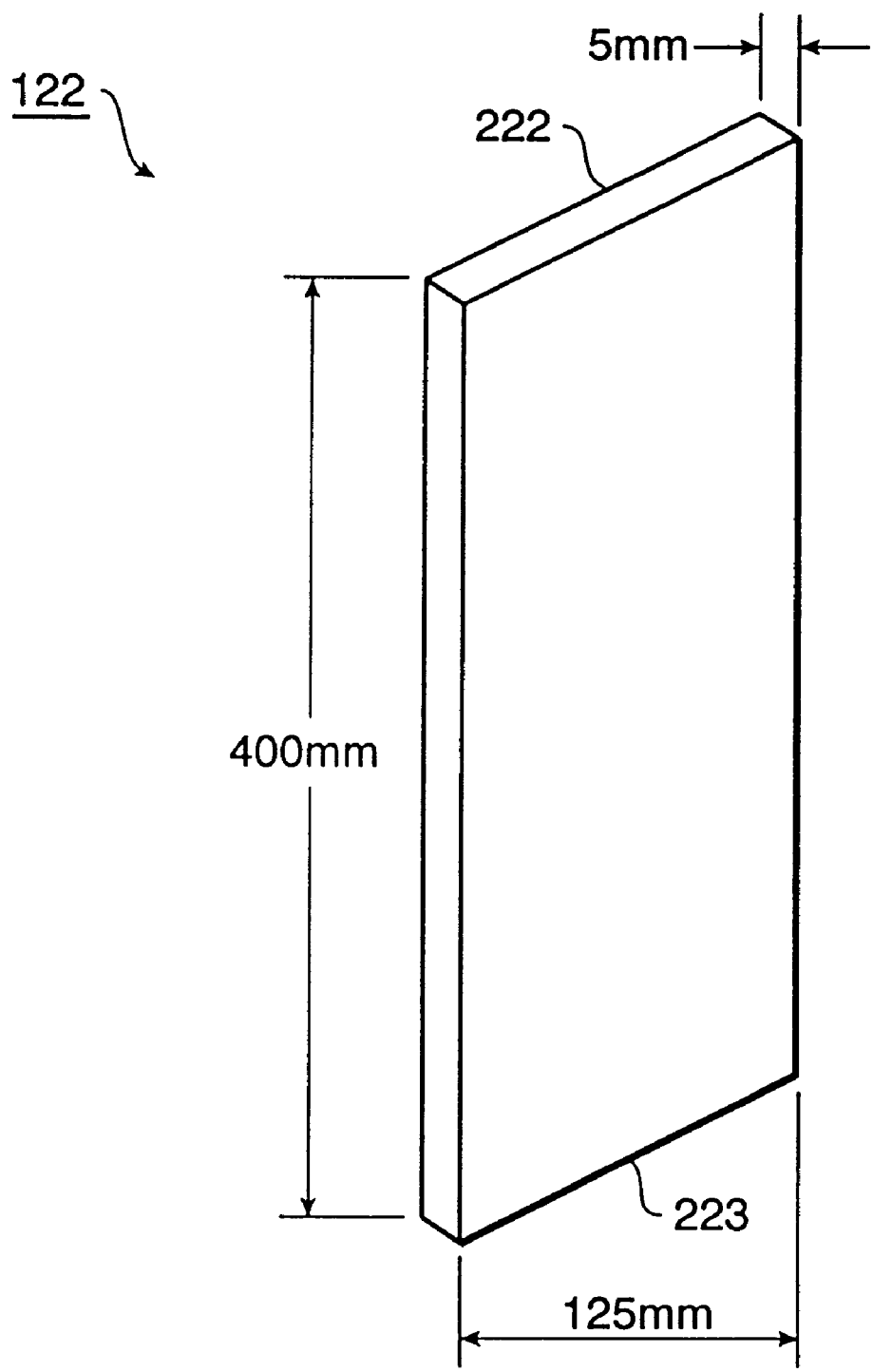
FIG. 12 is a view illustrating a structure of a post-integrator.

FIG. 12 is a view illustrating a structure of post-integrator 122, which is formed from a single slab of substantially transparent material. Post-integrator 122 has input face 222 and output face 223. The output face of the post-integrator corresponds to the output of homogenizer 103.

In the preferred embodiment, post-integrator 122 is a 400 millimeters by 125 millimeters by 5 millimeters slab of fused silica, which is used for its good resistance to thermal loads. All faces of post-integrator 122 are polished. In addition, input face 222 and output face 223 of post-integrator 122 have anti-reflection coatings.

In operation, substantially rectangular-shaped band of light 126 enters post-integrator 122 through input face 222. The post-integrator redistributes the light, via total internal reflections, so as to make it more uniform. At the same time, post-integrator 122 does not substantially decrease the telecentricity of the light. Substantially telecentric rectangular-shaped band of light 111 exits post-integrator through output face 223. Thus, post-integrator 122 effectively cancels out any minor non-uniformity introduced by image dissector 121.

Figures 13, 13A:
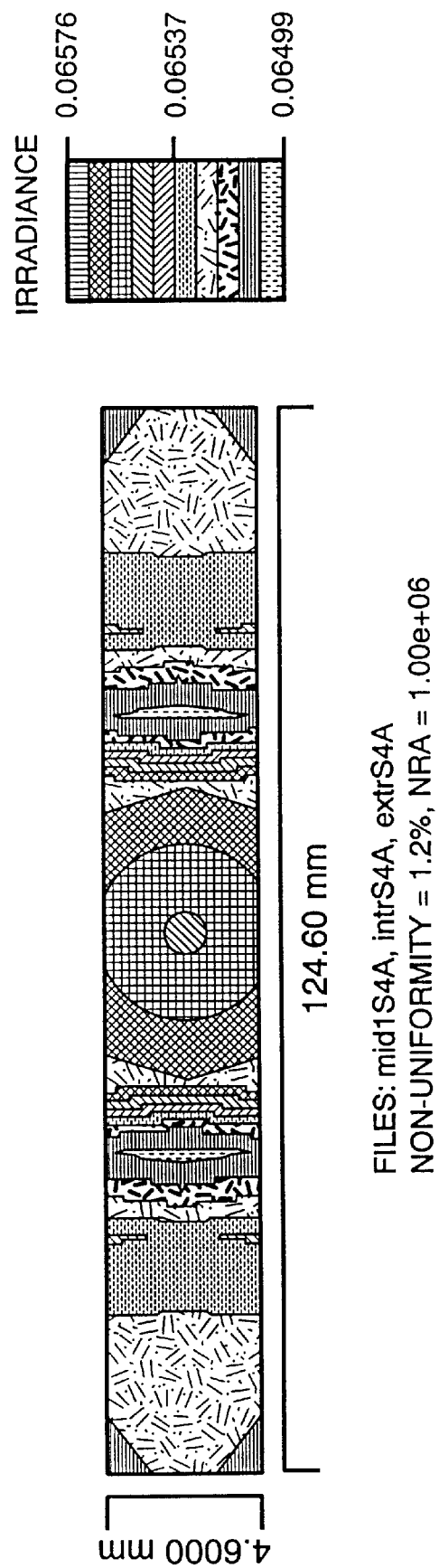
FIGS. 13a and 13b are graphs showing relative irradiance at the output face of a post-integrator.
Figure 13B:
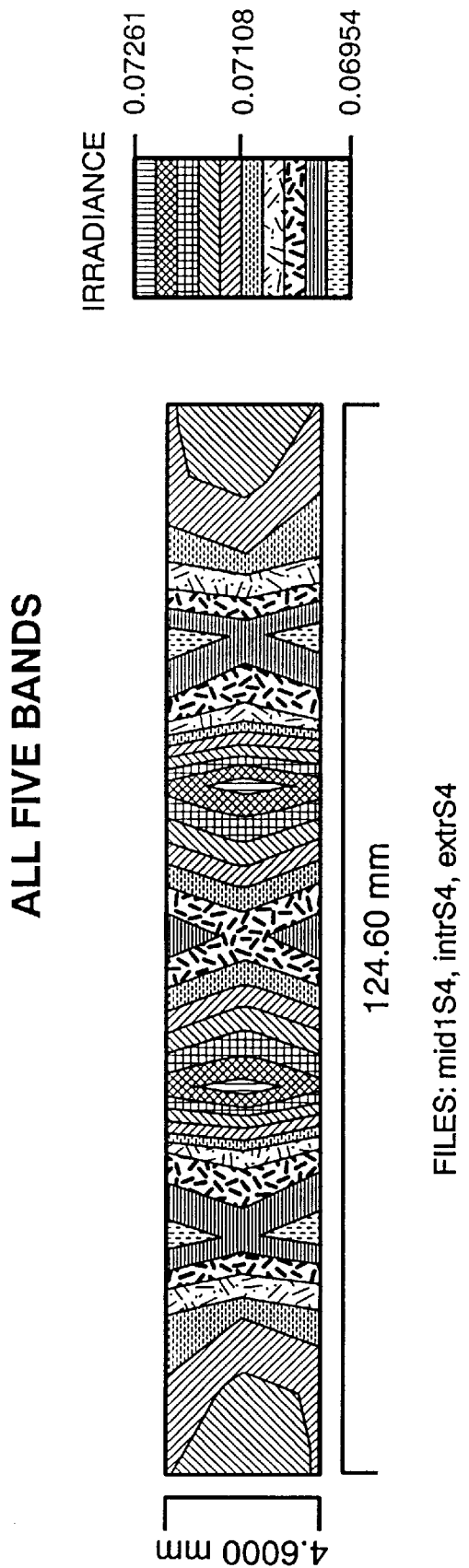

FIGS. 13a and 13b are graphs showing relative irradiance at output face 223 of post-integrator 122, which corresponds to the output of homogenizer 103. Therefore, these graphs illustrate the effectiveness of the homogenizer in transforming rotationally-symmetric light 110 from lamp 101 into substantially telecentric rectangular-shaped band of light 111.

FIG. 13a is a graph showing relative irradiance at output face 223 according to the preferred embodiment. This graph shows that irradiance at the output of homogenizer 103 is uniform to within ±0.6%.

By way of comparison, and to demonstrate the effectiveness of angular integrator 120, FIG. 13b is a graph showing relative irradiance at output face 223 in a case where the homogenizer does not include angular integrator 120. This graph shows irradiance uniform to within ±2.1%. Thus, angular integrator 120 is responsible for reducing the uniformity error from ±2.1% to ±0.6%. In other words, angular integrator 120 substantially increases the uniformity of the light exiting homogenizer 103.

FIGS. 14a through 14f are graphs showing pupil uniformity at output face 223 of post-integrator 122, which corresponds to the output of homogenizer 103.

Figures 14, 14A:
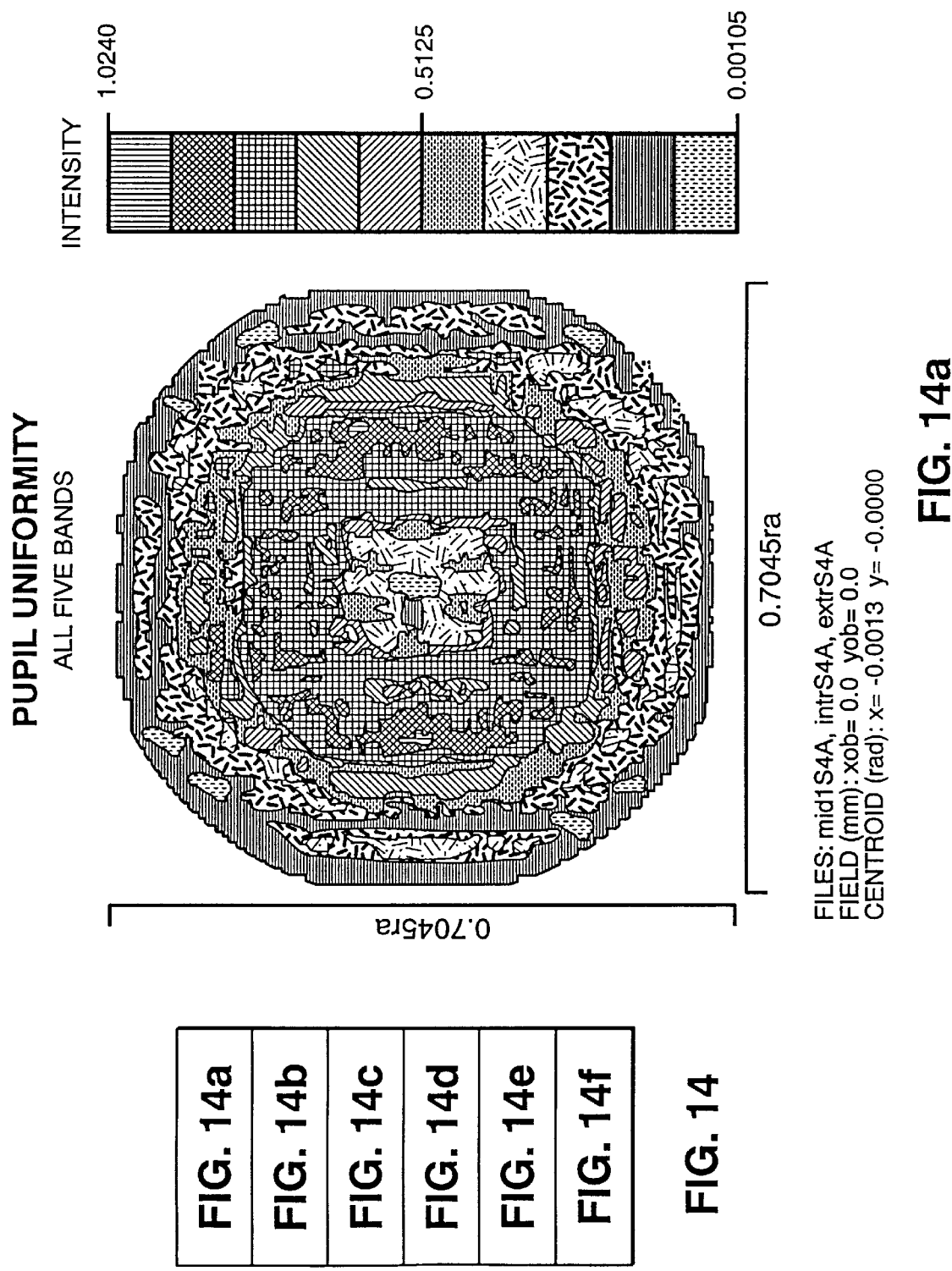
FIGS. 14a through 14f are graphs showing pupil uniformity at an output face of a post-integrator.
Figure 14B:
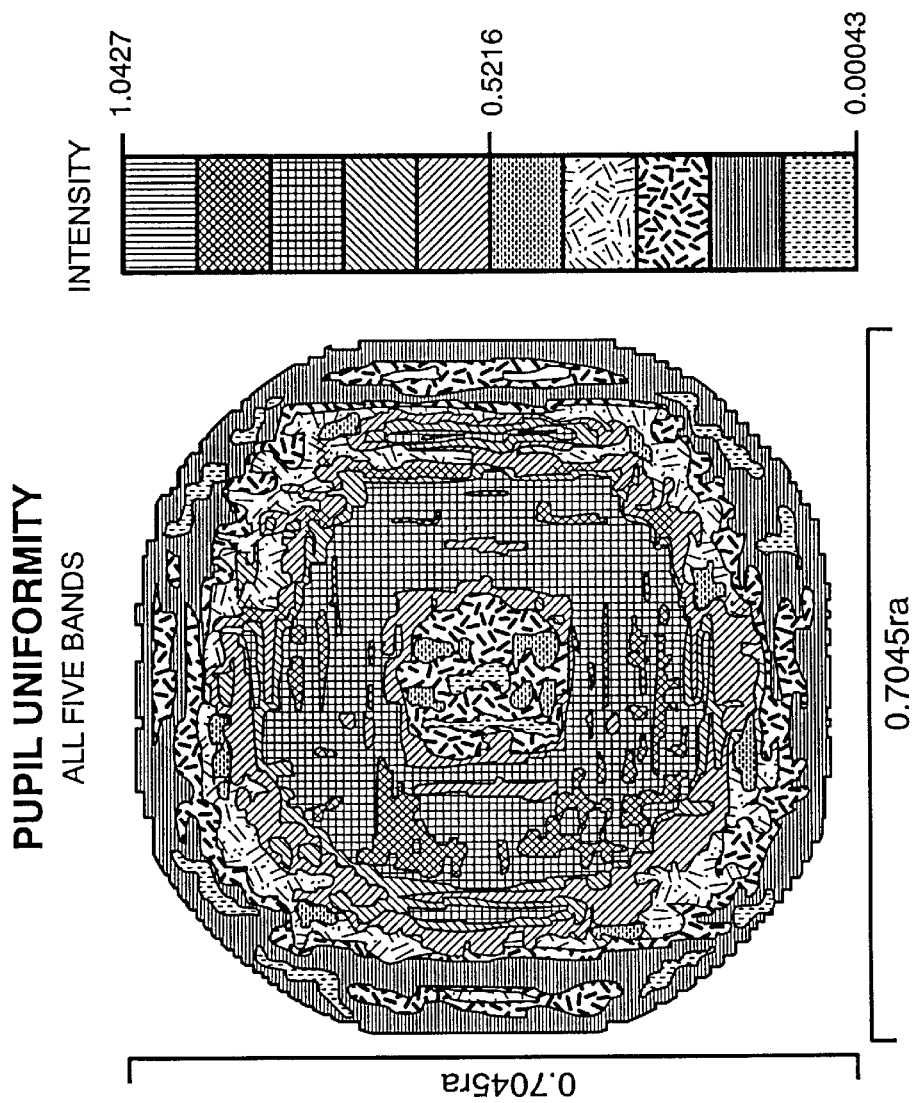
Figure 14C:
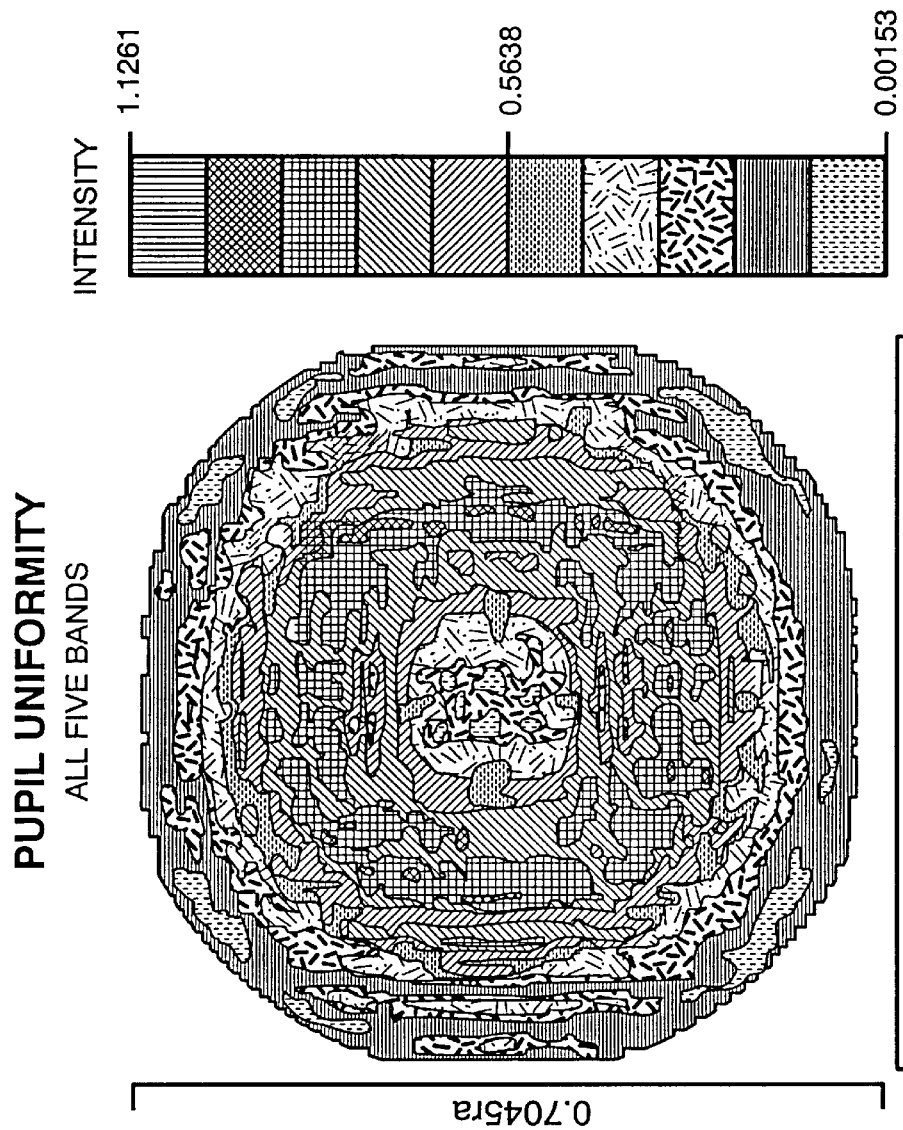

FIG. 14a is a graph showing pupil uniformity at the center of output face 223 according to the preferred embodiment. FIG. 14b is a graph showing pupil uniformity half-way between the center and an edge of output face 223 according to the preferred embodiment. FIG. 14c is a graph showing pupil uniformity at an edge of output face 223 according to the preferred embodiment.

In all three of these graphs, the images of arc 107 are effectively smeared out. In addition, the pattern of images does not change significantly as the observation point moves from the center of output face 223 (FIG. 14a) to an edge of output face 223 (FIG. 14c). This lack of shift indicates symmetrical pupil irradiance, symmetrical pupil distribution, uniform numerical aperture, and a high degree of telecentricity. In this case, the telecentricity error is approximately 1 milliradian.

Figure 14D:
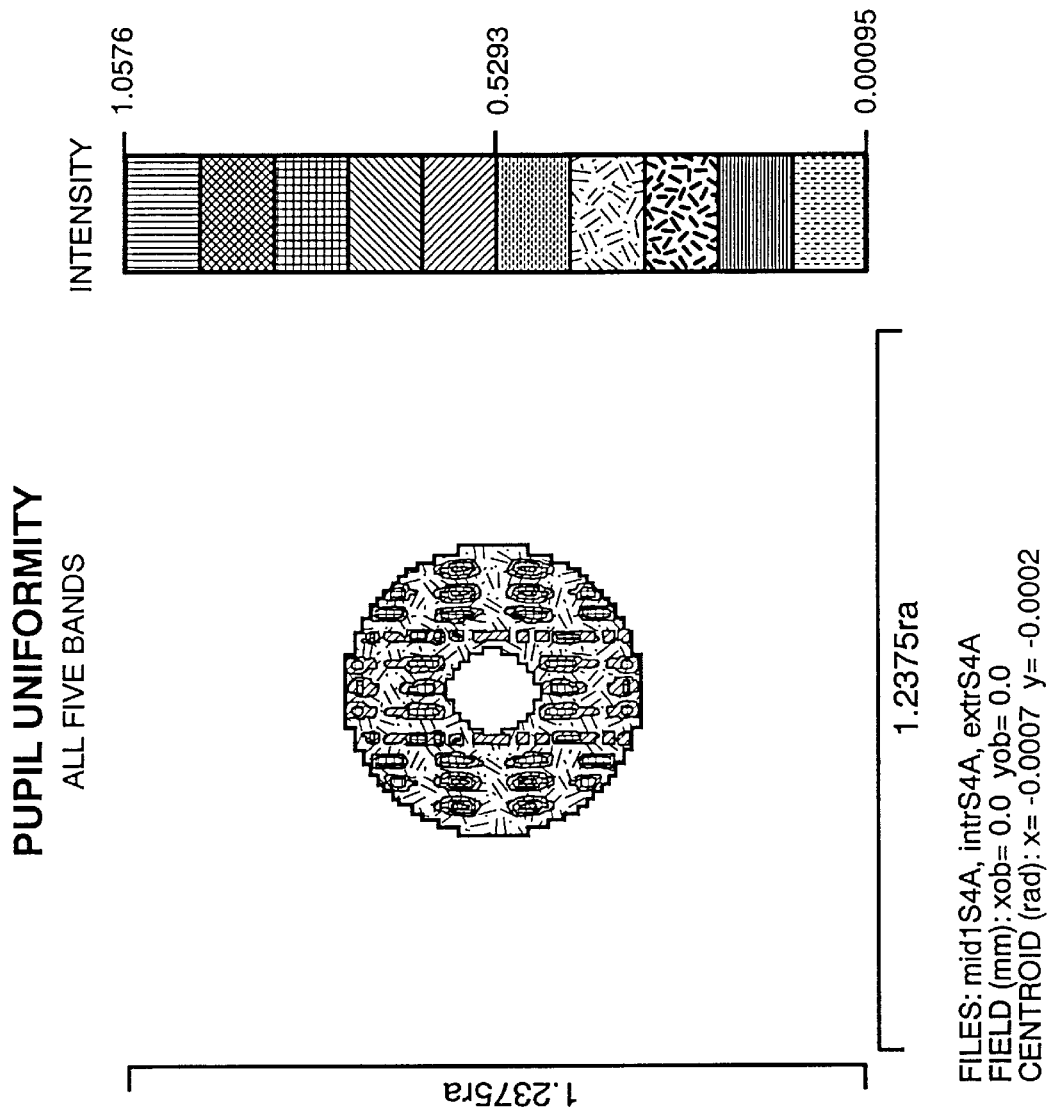
Figure 14E:
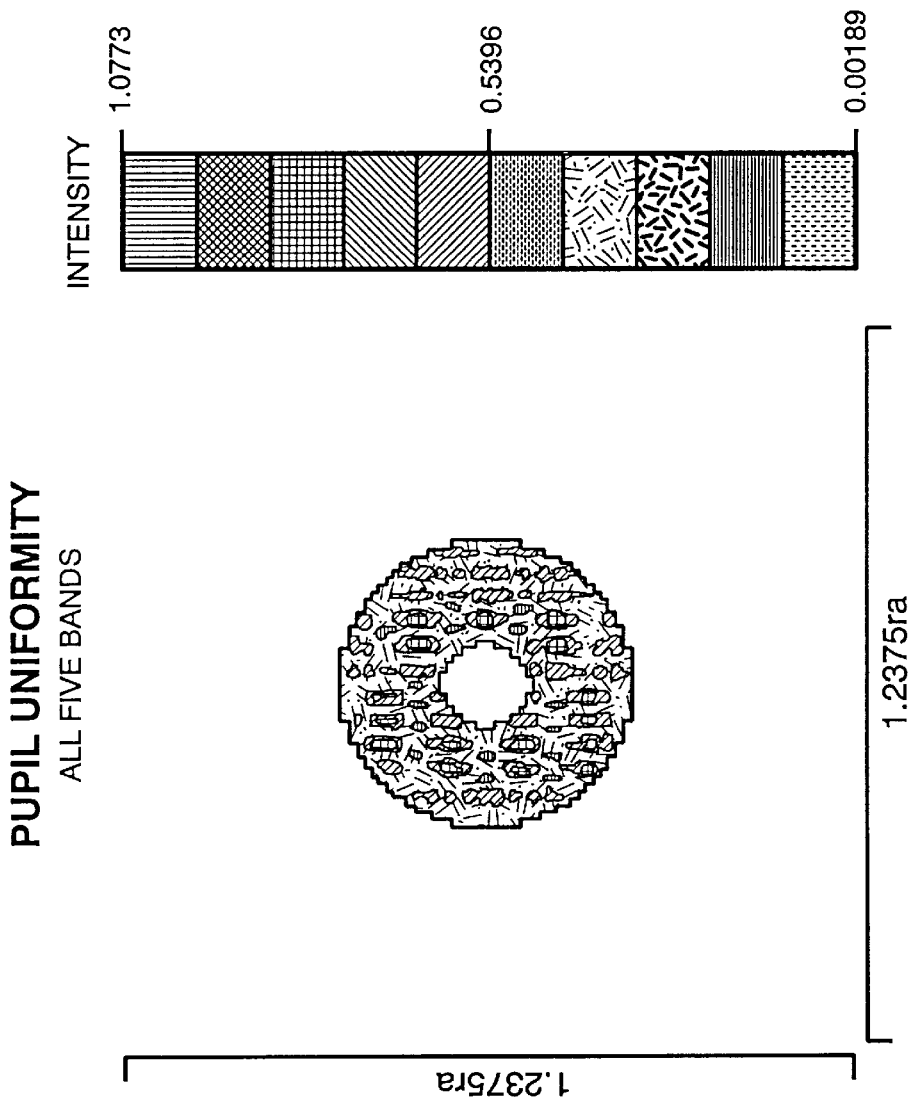
Figure 14F:
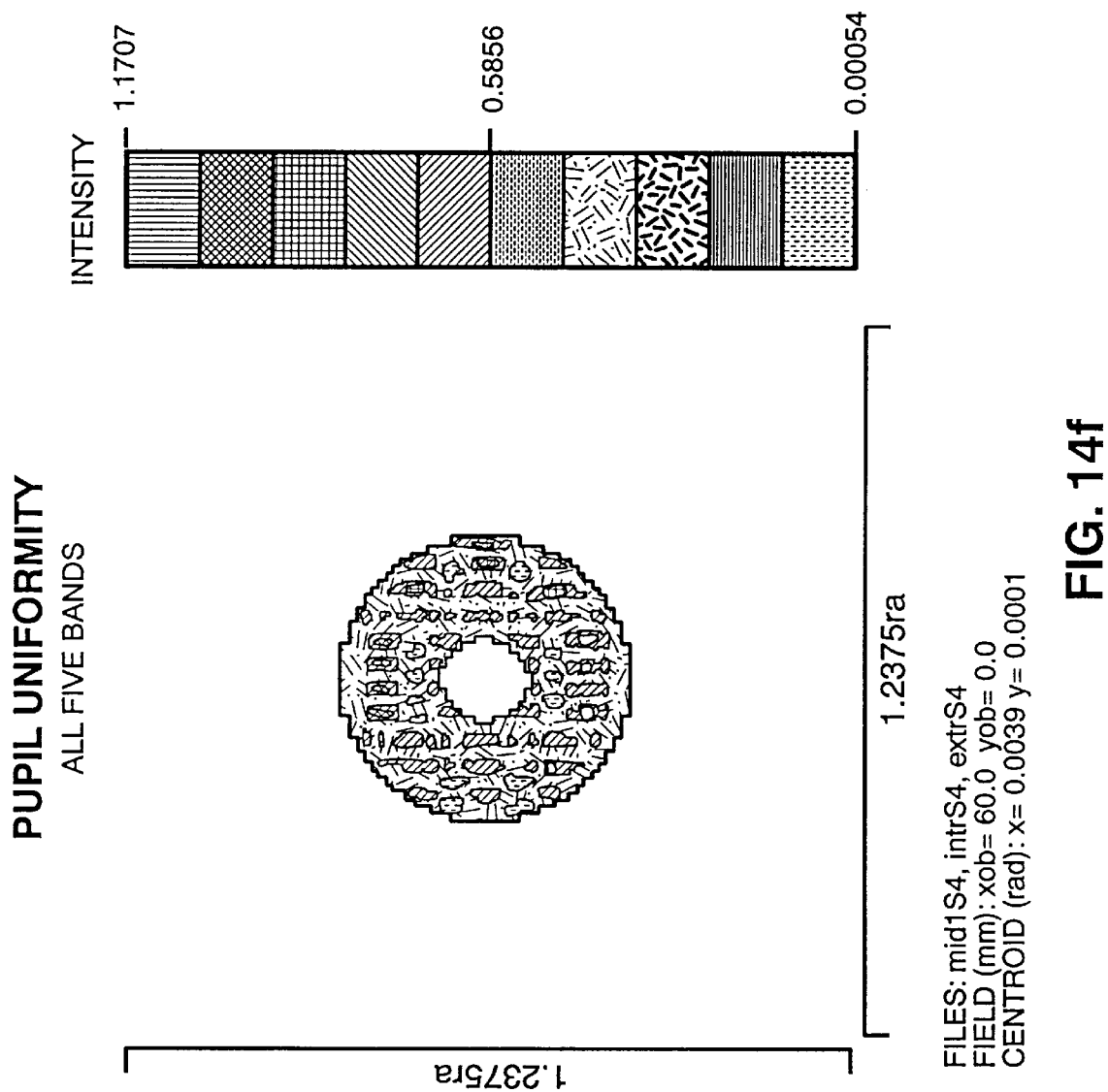

By way of comparison, and to demonstrate the effectiveness of angular integrator 120, FIGS. 14d through 14f are similar to FIGS. 14a through 14c, except they show pupil uniformity in a case where the homogenizer does not include angular integrator 120. FIG. 14d is a graph showing pupil uniformity at the center of output face 223 in this case, FIG. 14e is a graph showing pupil uniformity half-way between the center and an edge of output face 223 in this case, and FIG. 14f is a graph showing pupil uniformity at an edge of output face 223 in this case.

In all three of these graphs, the images of arc 107 are not smeared out. In addition, the pattern of images shifts significantly as the observation point moves from the center of output face 223 (FIG. 14d) to an edge of output face 223 (FIG. 14f). This shift indicates a lack of pupil symmetry and a lack of telecentricity. From only three observation points, it is not possible to determine the absolute maximum variation in telecentricity. However, from the observed degree of shift, a telecentricity error of ±8 milliradians is possible. Thus, the lack of angular integrator 120 substantially decreases the pupil symmetry and telecentricity of the light exiting homogenizer 103. In other words, angular integrator 120 advantageously increases the pupil symmetry and telecentricity of the light.

After substantially telecentric rectangular-shaped band of light 111 exits homogenizer 103, it is transformed by relay 104 and remapper 105 into substantially telecentric arcuate band of light 113, which is in turn reimaged by reimager 106 into arcuate band of light 6.

Figure 15:
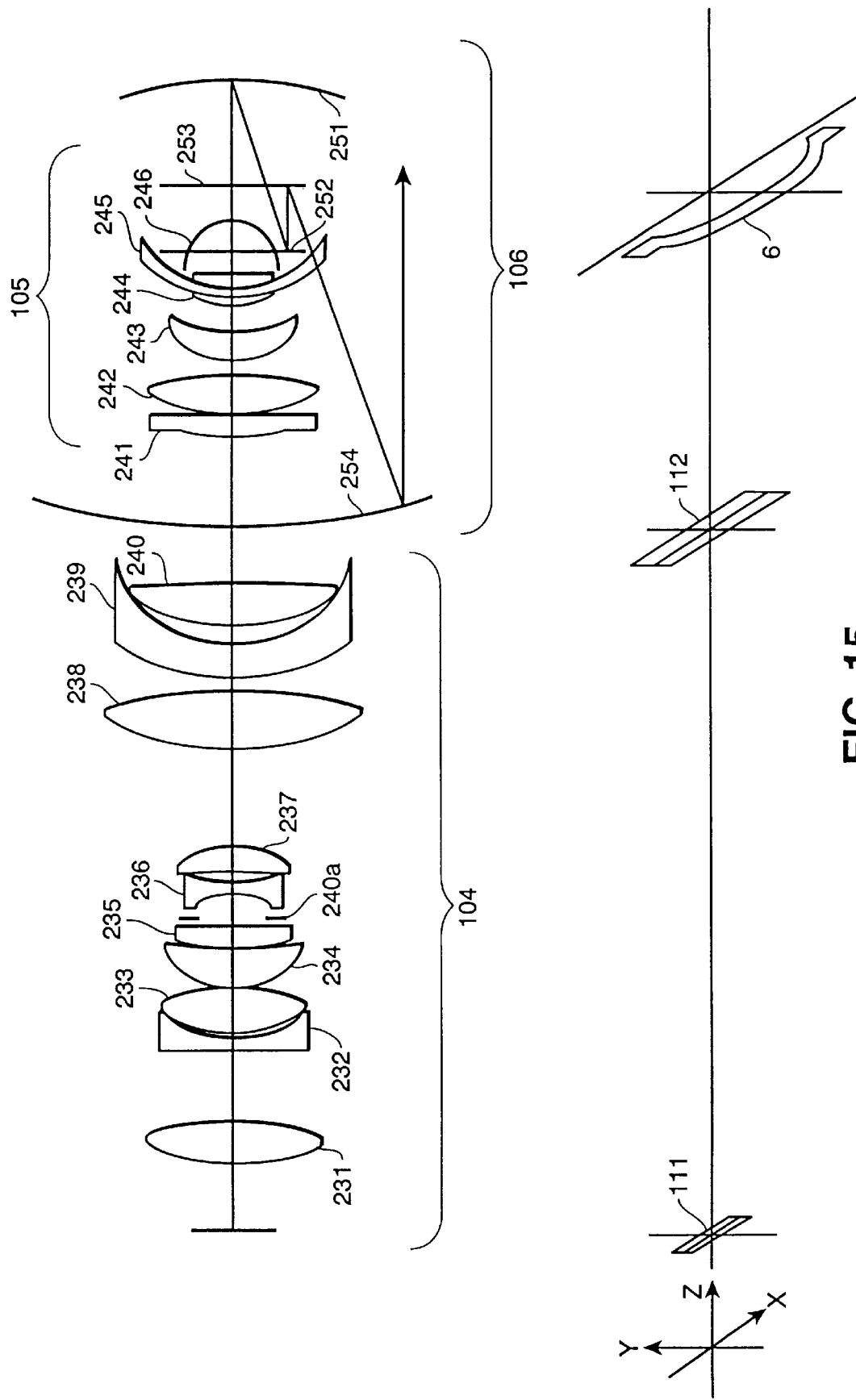
FIG. 15 is a view illustrating a structure and operation of a relay, a remapper, and a reimager.

FIG. 15 is a view illustrating a structure and operation of a relay, a remapper, and a reimager. Relay 104 includes spherical lenses 231 through 240. Remapper 105 includes lenses 241 through 245 and parabolic mirror 246. Reimager 106 includes spherical mirror 251, flat mirrors 252 and 253, and spherical mirror 254.

Note that the structures of remapper 105 and reimager 106 physically overlap. However, light passes completely through remapper 105 before entering reimager 106.

In operation, substantially telecentric rectangular-shaped band of light 111 enters relay 104 and passes through spherical lenses 231 through 240. These lenses simply magnify the image of the light by 1.6 times. The light exits relay 104 as intermediate image 112. Intermediate image 112 enters remapper 105 and passes through lenses 241 through 245. The light then reflects off parabolic mirror 246 and exits remapper 105 as substantially telecentric arcuate band of light 113 (not shown). This arcuate band of light enters reimager 106 and reflects off mirrors 251 through 254. These mirrors magnify the image of the arcuate band of light by two times. This magnified image then exits reimager 106 as arcuate band of light 6.

For clarity's sake, the structure and operation of relay 104, remapper 105, and reimager 106 are explained in more detail below with reference to a separate figure for each of these parts of projection light source 100.

Briefly, a relay and remapper for transforming a substantially rectangular-shaped band of light into a substantially arcuate band of light includes a lens system and a parabolic mirror. The lens system has a highly curved field that distorts the substantially rectangular-shaped band of light into a band of light with a curved image field whose radius of curvature is the same as the substantially arcuate band of light. In other words, the lens system imparts a curved image field to the substantially rectangular-shaped band of light. The parabolic mirror has a latus rectum that is approximately equal to a curvature of the substantially arcuate band of light and has a cross section at the latus rectum. The parabolic mirror is positioned at the curved image and reflects the light from the lens system into an arcuate band with a substantially flat image field.

Figure 16:
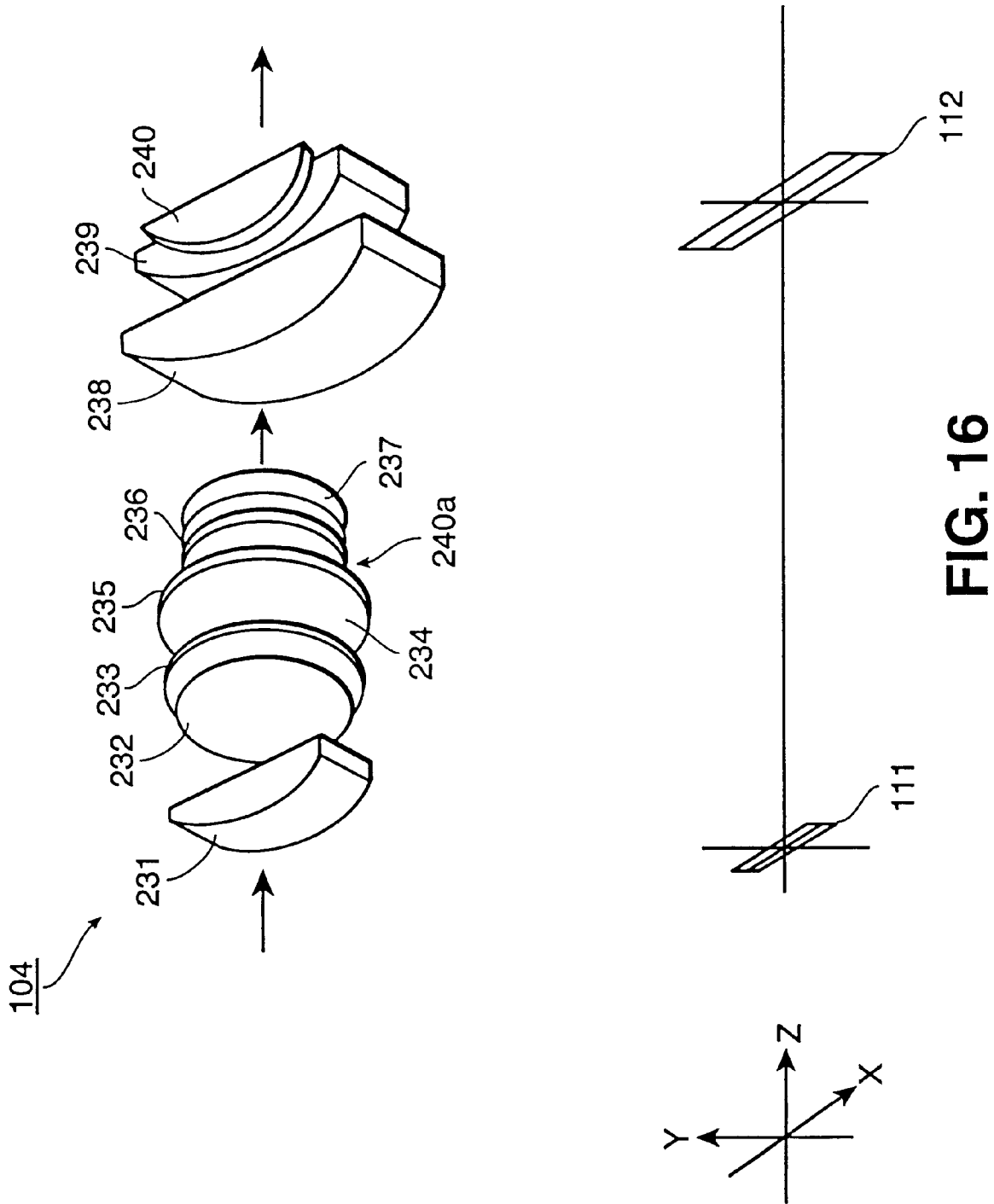
FIG. 16 is a view illustrating a structure and operation of a relay.

FIG. 16 is a view illustrating a structure and operation of a relay. Relay 104 includes ten spherical lenses 231 through 240. Light enters relay 104 through spherical lens 231, passes through spherical lenses 232 through 239, and exits through spherical lens 240. Relay 104 is preferably doubly telecentric, meaning that the design images stop at infinity telecentrically at both the input plane and the output plane for the relay.

All ten of spherical lenses 231 through 240 are preferably made from materials chosen for good transmittance and for correction of chromatic aberration between the i-line and the g-line of a mercury light source. The correction of chromatic aberration need not produce excellent imaging. Rather, the correction must only be sufficient to ensure good energy transfer efficiency and telecentricity across the full spectral band of lamp 101.

Because a refractive lens system with a single type of glass cannot be adequately corrected for chromatic aberration, two types of glass are used for lenses 231 through 240. In the preferred embodiment, these two types of glass are precision annealed fused silica and Ohara i-line glass.

All optical surfaces of the lenses are polished and have anti-reflection coatings. The edges of the lenses are ground and blackened. The specifications for lenses 231 through 240 are given in Table 1.

TABLE 1

Specifications for lenses 231 through 240.

| Lens | Glass Type and Index of Refraction | Input Face Radius | Output Face Radius | Edge Diameter | Central Thickness |
|---|---|---|---|---|---|
| 231 | BSL7Y Ohara n = 1.5163 | 199.1 convex | 301.4 convex | 190.6 | 46.1 |
| 232 | PBM2Y Ohara n = 1.6200 | 3973.1 convex | 112.5 concave | 161.0 | 13.0 |
| 233 | Silica n = 1.4585 | 130.2 convex | 187.3 convex | 155.1 | 49.9 |
| 234 | Silica n = 1.4585 | 85.6 convex | 395.9 concave | 143.2 | 43.4 |

TABLE 1-continued

Specifications for lenses 231 through 240.

| Lens | Glass Type and Index of Refraction | Input Face Radius | Output Face Radius | Edge Diameter | Central Thickness |
|---|---|---|---|---|---|
| 235 | BAL35Y Ohara n = 1.5891 | 177.4 convex | 1519.8 concave | 124.4 | 24.6 |
| 236 | PBM2Y Ohara n = 1.6200 | 71.5 concave | 153.1 convex | 105.5 | 12.5 |
| 237 | BAL35Y Ohara n = 1.5891 | 509.6 concave | 93.6 convex | 120.2 | 28.9 |
| 238 | BSM51Y Ohara n = 1.6031 | 288.2 convex | 430.0 convex | 277.0 | 63.6 |
| 239 | Silica n = 1.4585 | 217.5 convex | 131.8 concave | 254.9 | 37.3 |
| 240 | PBM2Y Ohara n = 1.6200 | 197.1 convex | 2902.3 convex | 219.5 | 44.8 |

All dimensions are in millimeters.

In the preferred embodiment, relay 104 contains the aperture stop for projection light source 100. Aperture stop 240*a* is decentered from a common axis of the relay for reasons described below. Aperture stop 204*a* has a radius of 83.1 millimeters and is decentered from the y-axis by −2.753 millimeters. The stop is positioned between spherical lens 235 and spherical lens 236.

In order to accommodate the decentered aperture stop, the part of projection light source 100 that optically follows the aperture stop must be decentered by −2.5716 millimeters along the y-axis and tilted downward by 0.4005 degrees from the x–z plane. In other words, lenses 236 through 245 and mirrors 251 through 254 lie on an optical axis that is at an angle of 0.4005 degrees from the optical axis for the rest of projection light source 100.

In operation, lenses 231 through 240 magnify substantially telecentric rectangular-shaped band of light 111 by 1.6 times, resulting in intermediate image 112. After exiting relay 104, intermediate image 112 enters remapper 105.

Figure 17:
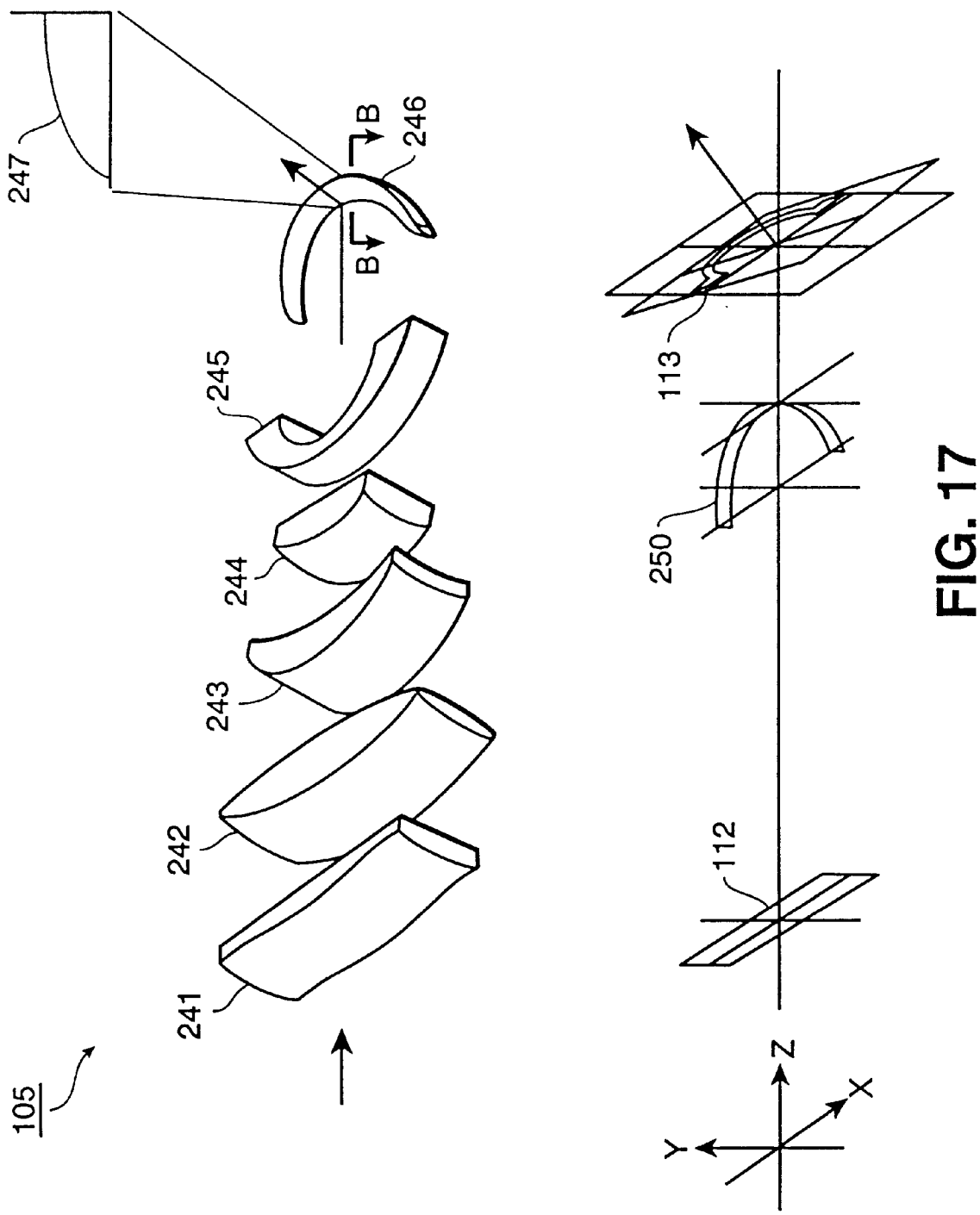
FIG. 17 is a view illustrating a structure and operation of a remapper.

FIG. 17 is a view illustrating a structure and operation of a remapper. As mentioned above, remapper 105 includes lenses 241 through 245 and parabolic mirror 246. In the preferred embodiment, lenses 241 through 245 are made of Ohara glass. The optical surfaces of the lenses are polished and have anti-reflection coatings. The edges of the lenses are ground and blackened. The specifications for lenses 241 through 245 are given in the Table 2.

TABLE 2

Specifications for lenses 111 through 115.

| Lens | Glass Type and Index of Refraction | Input Face Radius | Output Face Radius | Edge Diameter | Central Thickness |
|---|---|---|---|---|---|
| 241 | BSL7Y Ohara n = 1.5163 | Note 1 | Note 1 | 179.7 | 23.1 |
| 242 | BSL7Y Ohara n = 1.5163 | 184.7 convex | 347.0 convex | 184.9 | 44.5 |
| 243 | BSL7Y Ohara n = 1.5163 | Note 2 | Note 2 | 138.3 | 31.1 |
| 244 | BSL7Y Ohara n = 1.5163 | Note 3 | Note 3 | 83.4 | 34.3 |

TABLE 2-continued

Specifications for lenses 111 through 115.

| Lens | Glass Type and Index of Refraction | Input Face Radius | Output Face Radius | Edge Diameter | Central Thickness |
|---|---|---|---|---|---|
| 245 | BSL7Y Ohara n = 1.5163 | 47.1 convex | 89.3 concave | 158.9 | 10.0 |

All dimensions are in millimeters.
Notes 1 and 2:
These are aspheric lenses with an aspheric constant given by:

$$F(H) = \frac{(CURV1) * H^2}{1 + (1 - (CURV1)^2 * H^2)^{(1/2)}} + A * H^4 + B * H^6 + C * H^8$$

$$Z = F(H) + (1/2) * CURV2 * (S^2 + Z^2 - (F(H))^2)$$

Note 1:
CURV1 = −0.005185
CURV2 = −0.007705
A = 2.93507e-7
B = −1.84177e-11
C = 1.38092e-15
Note 2:
CURV1 = −0.011250
CURV2 = −0.008109
A = −2.73417e-7
B = 3.10268e-13
C = 1.86346e-15
Note 3:
This is an aspheric lens with an aspheric constant given by:

$$Z = \frac{(CURV) * X^2}{1 + (1 - (1 + K)(CURV)^2 * X^2)^{(1/2)}}$$

CURV = −0.01493744
K = −0.825452

Parabolic mirror 246 has an arc shape. The arc shape has a curvature that is approximately the same as substantially telecentric arcuate band of light 113. Cross section 247 of parabolic mirror 246, shown at line B—B in FIG. 17, is at the latus rectum. In the preferred embodiment, parabolic mirror 246 has an enhanced aluminum reflective coating with reflectivity of greater than 95%.

Briefly, in operation, the relay and remapper transform a substantially rectangular-shaped band of light into a substantially arcuate band of light. First, the lenses in the relay and remapper distort the substantially rectangular-shaped band of light into a band of light with a curved image field whose radius of curvature is the same as the substantially arcuate band of light. Then, the parabolic mirror in the remapper reflects the band of light with a curved image field into a substantially arcuate band of light with a substantially flat image field.

In more detail, lenses 241 through 245 together with lenses 231 through 240 have a highly curved field that distorts substantially telecentric rectangular-shaped band of light ill into curved image 250 (i.e., a band of light with a curved image field). In other words, the lenses impart a curvature to the image field of the band of light. The curved image field has a radius of curvature that is the same as the radius of the desired arc for the light output by the remapper.

In the preferred embodiment, arcuate band of light 6 has a radius of 175.0 millimeters. Reimager 106, discussed below, magnifies the output of remapper 105 by two times. Thus, in order to get arcuate band of light 6 with a radius of 175.0 millimeters at the output of reimager 106, remapper 105 must produce arcuate band of light 113 with a radius of 87.5 millimeters. Accordingly, curved image 250 has a radius of curvature of 87.5 millimeters.

Curved image 250 strikes parabolic mirror 246. The parabolic curvature and orientation of parabolic mirror 246 transforms curved image 250 into arcuate band of light 113, which has a substantially flat image field. As shown in FIG. 17, arcuate band of light 113 travels at a significant angle to the optical axis for the relay and remapper.

Relay 104 and remapper 105 introduce some telecentricity and pupil asymmetry error to the light. This error is illustrated in FIGS. 18 and 19, in a case where no steps are taken to reduce the error.

Figure 18:
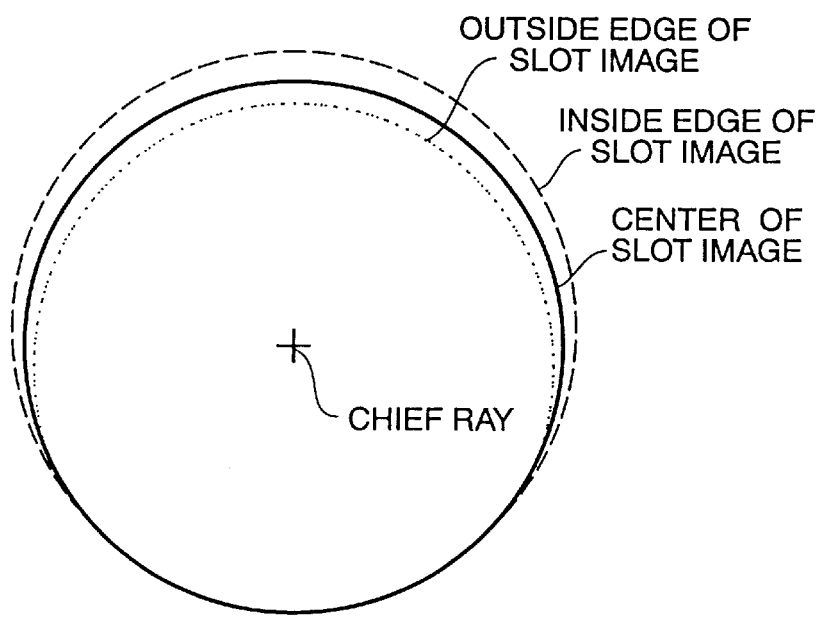
FIG. 18 is a view illustrating pupil footprints at 100 kilometers from an output of a relay and remapper.

FIG. 18 is a view illustrating pupil footprints at 100 kilometers from an output of a relay and remapper. The pupil image is not symmetric for all points along the arcuate band of light. Instead, the image is distorted: light from the bottom edge of the pupil is imaged into an edge, while light from the top edge of the pupil is imaged across an area. The size of the area depends on the position in the arcuate band of light.

Basically, this distortion occurs because substantially telecentric rectangular-shaped band of light 112 is bent into a curve by the lenses and the parabolic mirror. This bending compresses the side of the rectangular-shaped band of light that becomes the inside edge of the arcuate band of light. The compressed side has a pupil edge that is larger than the rest of the pupil. In a like manner, the bending expands the side of the rectangular-shaped band of light that becomes the outside edge of the arcuate band of light. This expanded side has a pupil edge that is smaller than the rest of the pupil. The bottoms of the pupil edges align. As a result, the tops of the differently-sized pupil edges do not align, causing an asymmetrical pupil footprint.

Figure 19:
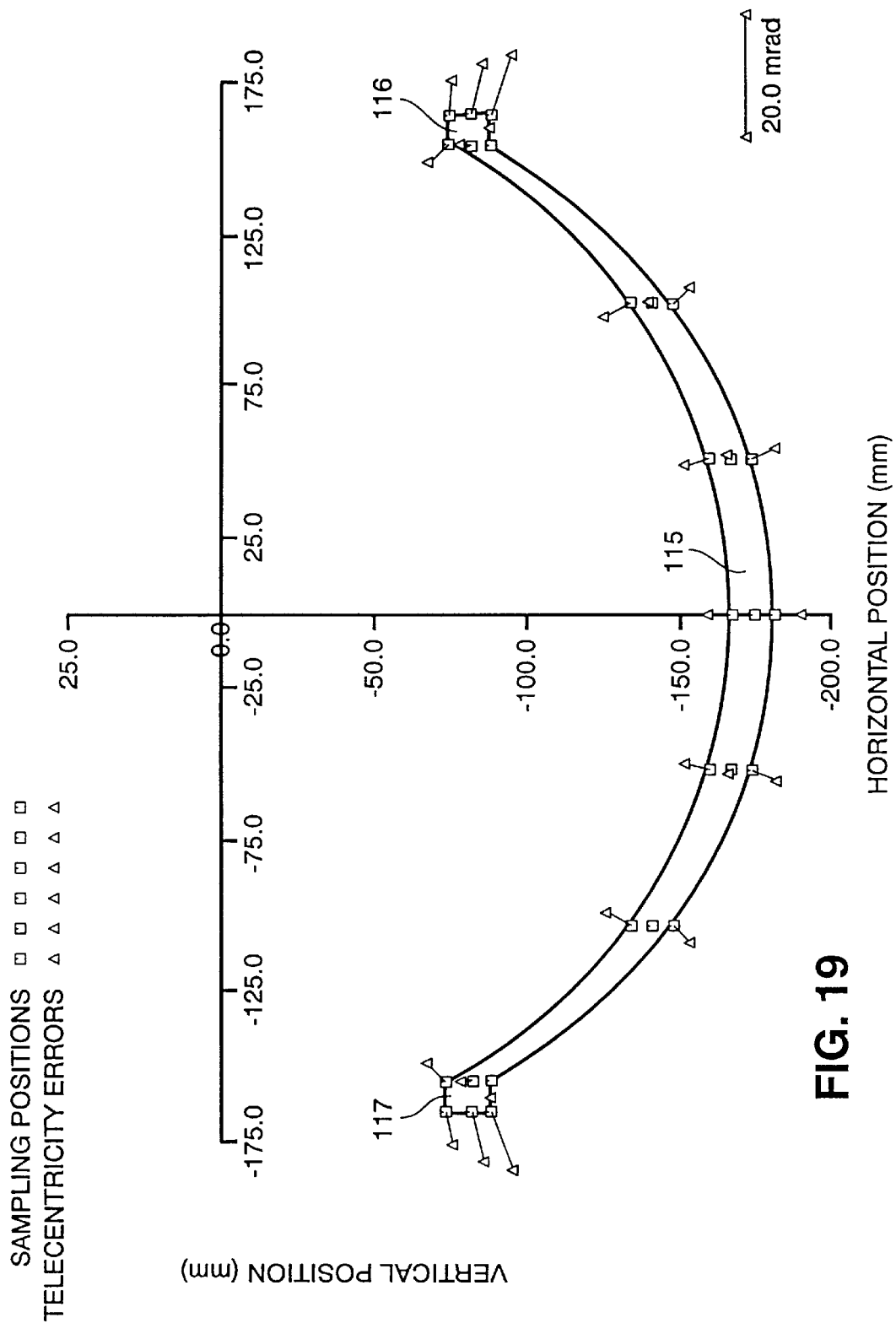
FIG. 19 is a view illustrating telecentricity error for an arcuate band of light at an output of a projection light source.

This lack of pupil symmetry results in telecentricity error, which is illustrated in FIG. 19. The range of the error is 9.0 milliradians in arc part 115 of the arcuate band of light and 10.6 milliradians in tab parts 116 and 117 of the arcuate band of light.

As mentioned above, FIGS. 18 and 19 are illustrations of pupil distortion and loss of telecentricity in a case where no steps are taken to reduce the error. One way to reduce the error is to decenter aperture stop 240a in relay 104. By decentering aperture stop 240a in the relay, the telecentricity error can be evenly split between positive and negative errors, greatly reducing the absolute magnitude of the error. With aperture stop 240a decentered, the telecentricity error is reduced to a maximum of ±4.6 milliradians. As mentioned above, decentering the aperture stop requires tilting and decentering parts of projection light source 100.

By means of the foregoing, a substantially telecentric rectangular-shaped band of light is transformed into a substantially telecentric arcuate band of light with minimal degradation in pupil symmetry and telecentricity.

After arcuate band of light 113 exits remapper 105, it enters reimager 106. The structure and operation of reimager 106 is well-known in the art, and a current production version of reimager 106 is manufactured by Canon. A brief description of the structure and operation of reimager 106 is given below for completeness.

Figure 20:
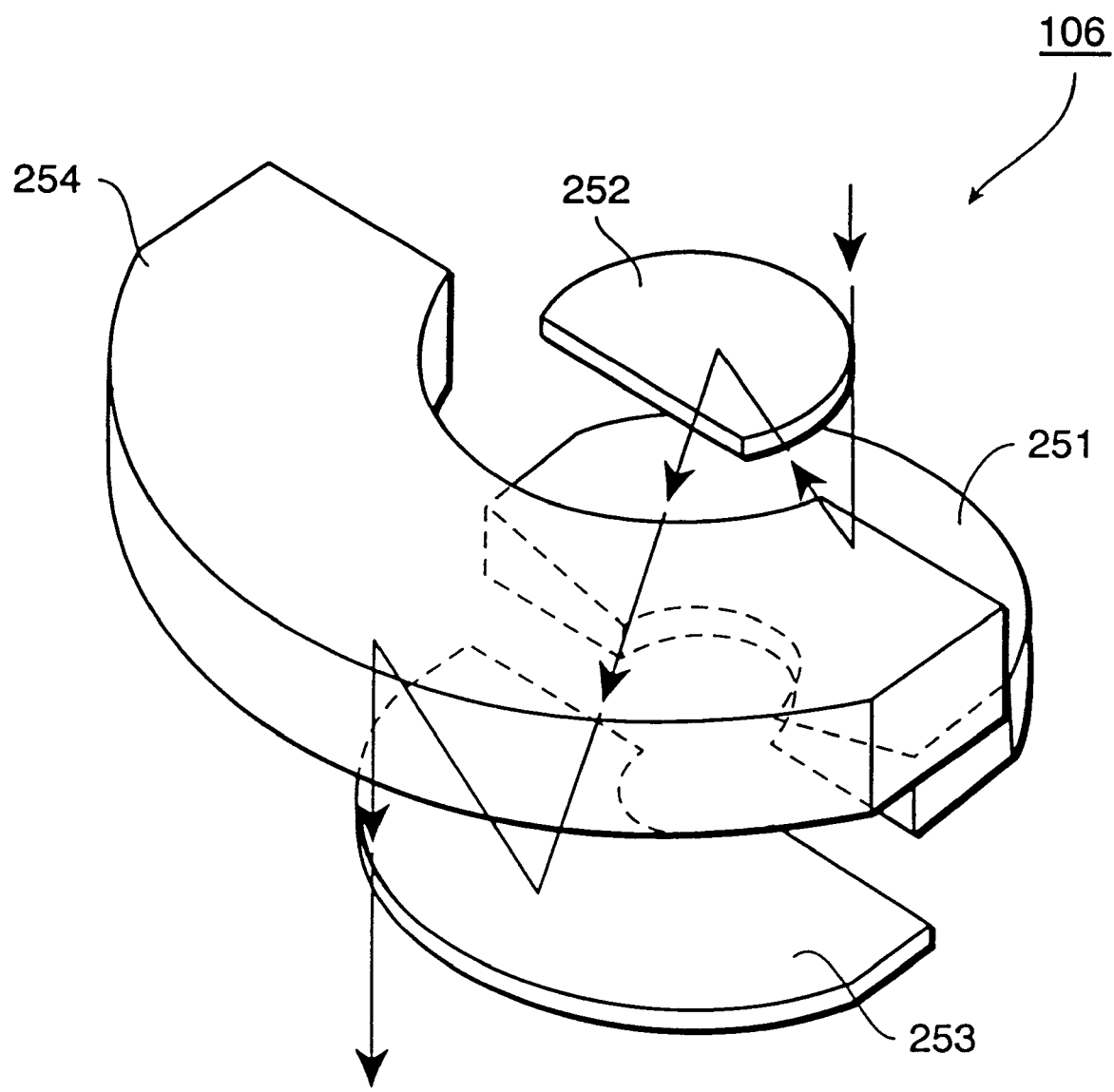
FIG. 20 is a view illustrating a structure of a reimager.

FIG. 20 is a view illustrating a structure of reimager 106, which reimages arcuate band of light 113 from remapper 105 into arcuate band of light 6. As mentioned above, reimager 106 includes spherical mirror 251, flat mirrors 252 and 253, and spherical mirror 254. These mirrors must be oriented so as to account for the decentering of aperture 240a and the direction of propagation of arcuate band of light 113.

In operation, reimager 106 magnifies arcuate band of light 113 by two times, resulting in arcuate band of light 6, and projects the light onto reticle 1. Light entering reimager 106 is reflected off spherical mirror 251, flat mirror 252, flat mirror 253, and spherical mirror 254. The light then exits reimager 106. Reimager 106 reimages the light while maintaining pupil symmetry and telecentricity of the light.

Figure 21:
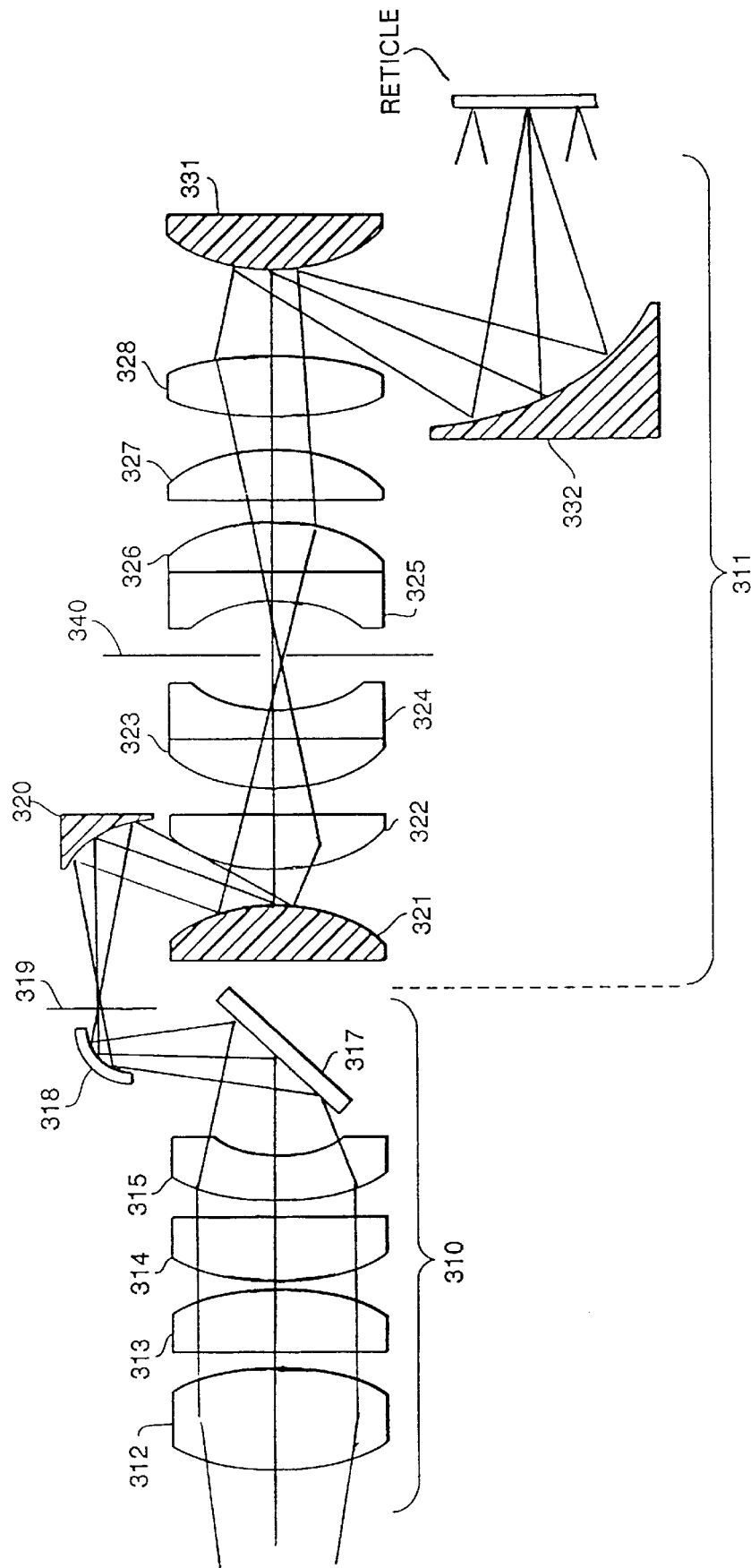
FIG. 21 is a view illustrating an alternative embodiment of a reimager.

In an alternative embodiment, a reimager that is not known in the art is utilized. FIG. 21 is an illustration of such a reimager, along with a slightly modified remapper 310 that can be used with the reimager.

Remapper 310 includes a lens system comprising lenses 312 through 315. The lens system has a highly curved field. The remapper also includes flat mirror 317, parabolic mirror 318, and ring field mask 319. Parabolic mirror 318 has a latus rectum of a paraboloid that is approximately equal to a curvature of the substantially arc-shaped band of light output by the remapper and has a cross section at the latus rectum.

Preferably, lenses 312 through 315 are made of Ohara glass. The optical surfaces of the lenses are polished and have antireflective coatings. The edges of the lenses are ground and blackened. In addition, flat mirror 317 and parabolic mirror 318 have enhanced aluminum reflective coatings with reflectivity greater than 95%.

Remapper 310 is substantially similar to and performs substantially the same function as remapper 105, described above. Namely, remapper 310 transforms a substantially rectangular-shaped band of light into a substantially arcuate band of light. However, several minor differences exist between remapper 310 and remapper 105. First, remapper 310 has slightly different lenses. Second, remapper 310 has flat mirror 317 and ring field mask 319, both of which are not present in remapper 105.

In operation in a projection light source, a substantially rectangular-shaped band of light is input into the remapper. As shown by the rays in FIG. 21, the light passes through lenses 312 to 315. These lenses distort the substantially rectangular-shaped band of light into a band of light with a curved image field whose radius of curvature is the same as the desired substantially arcuate band of light. The light then reflects off flat mirror 317, which simply redirects the light so as to aid alignment of remapper 310 with reimager 311. Next, the light reflects off parabolic mirror 318, which transforms the curved image into a substantially arcuate band of light with a substantially flat image field. Ring field mask 319 masks out unwanted (e.g., fringe) portions of the arcuate band of light.

Remapper 310 introduce some telecentricity and pupil asymmetry error to the light. This error is similar to the error introduced to the light by relay 104 and remapper 105, discussed above. Reimager 311 is designed to reduce this error.

Briefly, in the alternative embodiment, a reimager adaptable for use with a projection light source includes plural mirrors, a lens system, and an aperture stop within the lens system. A light reflects off at least one of the plural mirrors and then passes through the lens system. In the lens system, the image of the telecentric pupil forms at the interior stop and can be chipped by an iris or mechanical stop to control output exposure and telecentricity. After passing through the lens system, the light reflects off at least another of the plural mirrors.

In more detail, reimager 311 includes concave spherical mirror 320, convex spherical mirror 321, lenses 322 to 328, convex spherical mirror 331, and concave spherical mirror 322. Aperture stop 340 is disposed between lenses 324 and 325. Light passes through each of these elements as shown by the rays in FIG. 21.

Preferably, lenses 322 through 328 are made of Ohara glass. The optical surfaces of the lenses are polished and have antireflective coatings. The edges of the lenses are ground and blackened. In addition, spherical mirrors 320, 321, 331 and 332 have enhanced aluminum reflective coatings with reflectivities greater than 95%.

When reimager 311 is used with a projection light source, a substantially arcuate band of light is input to the reimager from remapper 310. For reasons explained below, the radii of curvature of the spherical mirrors and the configurations of the lenses are preferably chosen so that the arcuate band of light is magnified by 3.2 times. In addition, lenses 322 to 328 are preferably configured so that the light is focused into an image of the telecentric pupil between lenses 324 and 325, where aperture stop 340 is disposed.

The aperture size for aperture stop 340 preferably is chosen such that the aperture stop closes on a smallest pupil diameter of the light passing through the reimager. For example, with reference to FIG. 18, the smallest pupil diameter corresponds to the outside edge of the arcuate band of light. Thus, aperture stop 340 is chosen so that it closes on this pupil diameter. As a result, the larger pupil images corresponding to the inside edge of the arcuate band are masked down to this smallest pupil size by aperture stop 340. This masking of the larger pupil images compensates for the pupil asymmetry introduced by the remapper, thereby increasing the symmetry of pupil irradiance. In addition, because the aperture stop is in the reimager, no aperture stops needs to be placed in the relay. As a result, the relay optionally can be excluded from the projection light source. Note that if the relay is excluded from the projection light source, the reimager must magnify the image of the arcuate band by a factor of 1.6 times 2, or 3.2, so as to account for the loss of the 1.6 times magnification that the relay would provide if present.

Briefly, in operation, light is reimaged by reflecting off at least one mirror, passing through a lens system and an aperture stop within the lens system, and reflecting off at least another mirror. When the light passes through the lens system, it is focused into an image of the telecentric pupil. The light passes through the aperture stop substantially at this image.

In more detail, the operation of reimager 311 in a projection light source is illustrated by the rays in FIG. 21. A substantially arcuate band of light exits remapper 310 and enters reimager 311 at concave spherical mirror 320. The arcuate band reflects to convex spherical mirror 321 and then to lenses 322 though 324. These lenses focus the light into an image of the telecentric pupil, and the light passes through aperture stop 340 at this image.

When the light passes through the aperture stop, the pupil size of the light is masked down to the size of the aperture in the stop. Thus, all pupil images in the light that are larger than the aperture are screened down to the size of the aperture. As discussed above, the size of the aperture is preferably the same as the smallest pupil diameter in the arcuate band of light. Thus, all pupil images in the light are masked down to the same size, thereby compensating for the distortion of pupil images caused by the remapper.

After passing through aperture stop 340, the light passes through lenses 325 to 328, reflects off convex spherical mirror 331, and reflects off concave spherical mirror 322. The light then exits the reimager. When the arcuate band of light exits the reimager, it preferably has been magnified by 3.2 times.

By means of this method, the pupil size of the light is limited by the aperture stop as the light is reimaged. The limited pupil size results in increased symmetry of pupil irradiance. Again, as mentioned above, this method permits the projection light source to be constructed without a relay.

The present invention has been described with respect to particular illustrative embodiments. However, it is to be understood that the invention is not limited to the above-described embodiments and that various changes and modifications may be made by those of ordinary skill in the art without departing from the spirit and scope of the invention.

What is claimed is:

1. An optical projection system for use in photolithography, comprising:

optical elements that form a light into a substantially telecentric rectangular-shaped band of light;

a relay that forms a rectangular-shaped intermediate image from the substantially telecentric rectangular-shaped band of light;

a remapper that deforms the rectangular-shaped intermediate image into a band of light with a curved image field and that forms the band of light with a curved image field into a substantially arcuate band of light that is substantially telecentric; and a reimager that reimages the substantially arcuate band of light from the remapper.

2. An optical projection system according to claim 1, wherein the optical elements that form a light into a substantially telecentric band of light further comprise:

a field lens;

a fore-integrator;

an angular integrator;

an image dissector; and a post-integrator.

3. An optical projection system according to claim 1, wherein the optical elements that form a light into a substantially telecentric band of light include an image dissector, the image dissector comprising:

an input face, an output face, and plural elements that redirect light from the input face to the output face;

wherein the output face has a substantially rectangular shape that is different than that of the input face and wherein at least one of the plural elements has at least one coating that reduces optical transmission efficiency of the at least one of the plural elements so as to ensure approximately uniform irradiance of the output face.

4. An optical projection system according to claim 3, wherein the input face of the image dissector has a substantially square shape.

5. An optical projection system according to claim 4, wherein the plural elements of the image dissector further comprise planar blocks and prisms.

6. An optical projection system according to claim 5, wherein the planar blocks and prisms are separated by small airspaces.

7. An optical projection system according to claim 5, wherein at least one planar block or prism comprising one of the plural elements of the image dissector has an identical shape to at least one planar block or prism comprising another of the plural elements of the image dissector.

8. An optical projection system according to claim 5, wherein the coating that reduces optical transmission efficiency is on an interior surface of the at least one of the plural elements of the image dissector, the interior surface being a face of a planar block or prism that adjoins another planar block or prism.

9. An optical projection system according to claim 3, wherein the plural elements of the image dissector further comprise:
- an interior element that allows light to pass straight through from the input face to the output face;
- two intermediate elements that redirect light from beside the interior element in the input face to the ends of the interior element in the output face; and
- two exterior elements that redirect light from beside the intermediate elements in the input face to the ends of the intermediate elements in the output face.

10. An optical projection system according to claim 9, wherein the interior element and the intermediate elements of the image dissector each have the coating that reduces optical transmission efficiency.

11. An optical projection system according to claim 3, wherein the plural elements of the image dissector are made of UV grade fused silica, whereby the image dissector is resistant to thermal loads.

12. An optical projection system according to claim 1, wherein the relay and remapper further comprise:
- a lens system with a highly curved field that distorts the substantially rectangular-shaped band of light into a band of light with a curved image field whose radius of curvature is the same as the substantially arcuate band of light; and
- a parabolic mirror with a latus rectum that is approximately equal to a curvature of the substantially arcuate band of light and with a cross section at the latus rectum.

13. An optical projection system according to claim 12, wherein the lens system of the relay and remapper further comprises lenses made from different types of material, the different types of material chosen so as to correct for chromatic aberration.

14. An optical projection system according to claim 12, wherein the parabolic mirror of the relay and remapper has an enhanced aluminum reflective coating.

15. An optical projection system according to claim 12, wherein the relay and remapper further comprises an aperture stop positioned within the relay, the aperture stop being decentered from a common optical axis for the relay and remapper, whereby telecentricity and pupil symmetry for the substantially arcuate band of light are substantially maintained.

16. An optical projection system according to claim 1, wherein the relay and remapper further comprise:
- a lens system that imparts a curved image field to the substantially rectangular-shaped band of light; and
- a curved mirror that reflects light from the lens system into a substantially arcuate band with a substantially flat image field.

17. An optical projection system according to claim 16, wherein the lens system of the relay and remapper further comprises lenses made from different types of material, the different types of material chosen so as to correct for chromatic aberration.

18. An optical projection system according to claim 16, wherein the parabolic mirror of the relay and remapper has an enhanced aluminum reflective coating.

19. An optical projection system according to claim 16, wherein the relay and remapper further comprises an aperture stop positioned within the relay, the aperture stop being decentered from a common optical axis for the relay and remapper, whereby telecentricity and pupil symmetry for the substantially arcuate band of light are increased.

20. An optical projection system according to claim 1, wherein the reimager further comprises:
- plural mirrors,
- a lens system, and
- an aperture stop within the lens system;
- wherein the band of light reflects off at least one of the plural mirrors, passes through the lens system, and then reflects off at least another of the plural mirrors, and
- wherein as the band of light passes through the lens system, the band of light is focused into a pupil image and passes through the aperture stop substantially at the pupil image.

21. An optical projection system according to claim 20, wherein the plural mirrors of the reimager further comprise:
- a first concave spherical mirror,
- a first convex spherical mirror,
- a second convex spherical mirror, and
- a second concave spherical mirror; and wherein the band of light reflects off the first concave spherical mirror and then the first convex spherical mirror before passing through the lens system, and then reflects off the second convex spherical mirror and then the second concave spherical mirror after passing through the lens system.

22. An optical projection system according to claim 20, wherein the aperture stop of the reimager closes on a smallest pupil diameter of the band of light.

23. An optical projection system according to claim 20, wherein the reimager magnifies the band of light by 3.2 times.

24. An optical projection system for use in photolithography, comprising:
- optical elements that form a light into a substantially telecentric rectangular-shaped band of light;
- a remapper that deforms the rectangular-shaped intermediate image into a band of light with a curved image field and that forms the band of light with a curved image field into a substantially arcuate band of light that is substantially telecentric; and
- a reimager that reimages the substantially arcuate band of light from the remapper, the reimager further comprising mirrors, a lens system, and an aperture stop within the lens system.

25. A method for transforming a light into a substantially telecentric substantially arcuate band of light for use in photolithography, comprising the steps of:
- forming the light into a substantially telecentric rectangular-shaped band of light;
- forming a rectangular-shaped intermediate image from the substantially telecentric rectangular-shaped band of light;
- deforming the rectangular-shaped intermediate image into a band of light with a curved image field;
- forming the band of light with a curved image field into a substantially arcuate band of light that is substantially telecentric; and
- reimaging the substantially arcuate band of light.

26. A method according to claim 25, wherein the step of forming the light into a substantially telecentric rectangular-shaped band of light further comprises the steps of:
- collimating an aperture for the light;
- rearranging energy in the light, via multiple total internal reflection, into a substantially square-shaped band of light with a nearly uniform irradiance; and integrating the substantially square-shaped band of light by dividing the light into multiple beams whose sum is nearly telecentric and summing the beams.

27. A method according to claim 25, wherein the step of forming the light into a substantially telecentric rectangular-shaped band of light further comprises:

a dissecting step of dissecting the light into plural bands of light;

a redirecting step of redirecting the plural bands of light into the rectangular-shaped band of light; and an attenuating step of attenuating at least one of the plural bands of light so as to ensure approximately uniform irradiance of the rectangular-shaped band of light.

28. A method according to claim 27, wherein the light is a substantially square-shaped band of light.

29. A method according to claim 28, wherein the attenuating step occurs coextensively with the dissecting step and the redirecting step.

30. A method according to claim 28, wherein in the dissecting step, the substantially square-shaped band of light is dissected into an interior band of light, two intermediate bands of light, and two exterior bands of light;

wherein in the redirecting step, the interior band of light is redirected to a center of the substantially rectangular-shaped band of light, the two intermediate bands of light are redirected to ends of the interior band of light in the substantially rectangular-shaped band of light, and the two exterior bands of light are redirected to ends of the intermediate bands of light in the substantially rectangular-shaped band of light; and wherein the interior band of light and the intermediate bands of light are attenuated in the attenuating step.

31. A method according to claim 25, wherein in the step of deforming the rectangular-shaped intermediate image into a band of light with a curved image field, the curved image filed has a radius of curvature that is the same as the substantially arcuate band of light; and wherein the step of forming the band of light with a curved image field into a substantially arcuate band of light that is substantially telecentric further comprises reflecting the band of light with the curved image field into the substantially arcuate band of light with a parabolic mirror, the parabolic mirror having a latus rectum this is approximately equal to a curvature of the substantially arcuate band of light and having a cross section at the latus rectum.

32. A method according to claim 31, further comprising the step of correcting the light for chromatic aberration.

33. A method according to claim 31, further comprising the step of increasing telecentricity and pupil symmetry for the substantially arcuate band of light with a decentered aperture stop.

34. A method according to claim 25, wherein the step of forming the band of light with a curved image field into a substantially arcuate band of light that is substantially telecentric further comprises reflecting the substantially rectangular-shaped band of light with the curved image field into a substantially arcuate band of light with a substantially flat image field.

35. A method according to claim 34, further comprising the step of correcting the light for chromatic aberration.

36. A method according to claim 34, further comprising the step of increasing telecentricity and pupil symmetry for the substantially arcuate band of light with a decentered aperture stop.

37. A method according to claim 25, wherein the step of reimaging the substantially arcuate band of light further comprises the steps of:

reflecting the light off at least one mirror, passing the light through a lens system and an aperture stop within the lens system, the light being focused into a pupil image in the lens system and passing through the aperture stop substantially at the waist, and reflecting the light off at least another mirror.

38. A method according to claim 37, wherein when the light passes through the aperture stop, a pupil diameter of the light is restricted to a smallest pupil diameter of the light before passing through the aperture stop.

39. A method according to claim 37, wherein reimaging the substantially arcuate band of light magnifies the band of light by 3.2 times.

40. An optical projection system for use in photolithography, comprising:

optical elements that form a light into a rectangular-shaped band of light;

a remapper that forms the rectangular-shaped band of light into a substantially arcuate band of light; and a reimager that reimages the substantially arcuate band of light from the remapper, wherein the arcuate band of light from the reimager is substantially telecentric.

41. A method for producing a device comprising:

a step of transcribing a pattern formed on a first substrate to a second substrate by the projector according to claim 40; and a step of developing the second substrate transcribed the pattern.

42. A method for projecting source light to a reticle in an optical projection system for photolithography, said method comprising:

forming light from the projection light source into a rectangular-shaped band of light using optical elements;

remapping the rectangular-shaped band of light to form a substantially arcuate band of light;

reimaging the remapped substantially arcuate band of light so that it is substantially telecentric; and projecting the reimaged and remapped substantially arcuate band of light to the reticle.

43. A projector for use in photolithography, comprising:

an illumination optical system for illuminating a first substrate having a pattern, wherein said illumination optical system comprises an optical component which converts source light to an arcuate-shaped light by refracting and reflecting the source light, and the first substrate is illuminated by the arcuate-shaped light converted by the optical component; and projection optical system for projecting the pattern to a second substrate, wherein said projector performs scanning exposure to the pattern on the second substrate by moving the first

* * * * *

UNITED STATES PATENT AND TRADEMARK OFFICE
CERTIFICATE OF CORRECTION

PATENT NO.     : 6,144,495
DATED          : November 7, 2000
INVENTOR(S)    : Donald Koch et al.

It is certified that error appears in the above-identified patent and that said Letters Patent is hereby corrected as shown below:

Column 1,
Line 67, change "Eximer" to -- Excimer --.

Column 10,
Line 44, change "increase" to -- increases --.

Column 14,
Line 60, change "coatings" to -- coating --.

Column 16,
Line 11, change "coating" to -- coatings --; and
Line 50, change "post-integrator" to -- post-integrator 122 --.

Column 20,
Line 51, change "light ill" to -- light 111 --.

Column 22,
Line 44, change "introduce" to -- introduces --.

Column 23,
Line 27, change "stop needs" to -- stop need --.

Column 27,
Line 35, change "filed" to -- field --; and
Line 43, change "this is" to -- that is --.

UNITED STATES PATENT AND TRADEMARK OFFICE
CERTIFICATE OF CORRECTION

PATENT NO. : 6,144,495
DATED : November 7, 2000
INVENTOR(S) : Donald Koch et al.

It is certified that error appears in the above-identified patent and that said Letters Patent is hereby corrected as shown below:

<u>Column 28,</u>
Line 62, change "first" to -- first and second substrates relatively to the arcuate-shaped light. --

Signed and Sealed this

Thirteenth Day of August, 2002

Attest:

JAMES E. ROGAN
Attesting Officer     Director of the United States Patent and Trademark Office